(12) United States Patent
Honda et al.

(10) Patent No.: US 7,990,447 B2
(45) Date of Patent: Aug. 2, 2011

(54) SOLID-STATE IMAGE SENSOR

(75) Inventors: Hiroto Honda, Tokyo (JP); Yoshinori Iida, Tokyo (JP); Yoshitaka Egawa, Yokohama (JP); Goh Itoh, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 203 days.

(21) Appl. No.: 11/815,903

(22) PCT Filed: Jun. 14, 2007

(86) PCT No.: PCT/JP2007/062470
§ 371 (c)(1),
(2), (4) Date: Dec. 2, 2008

(87) PCT Pub. No.: WO2007/145373
PCT Pub. Date: Dec. 21, 2007

(65) Prior Publication Data
US 2010/0157091 A1    Jun. 24, 2010

(30) Foreign Application Priority Data

Jun. 14, 2006 (JP) ................................. 2006-165053
Jan. 26, 2007 (JP) ................................. 2007-016971

(51) Int. Cl.
*H04N 3/14* (2006.01)
*H04N 5/335* (2006.01)
*H04N 9/04* (2006.01)
*H04N 9/73* (2006.01)
*G06K 9/00* (2006.01)

(52) U.S. Cl. ..................... 348/294; 348/278; 348/223.1; 382/162; 382/167

(58) Field of Classification Search .................. 348/294, 348/223.1–225.1; 382/162, 167
See application file for complete search history.

(56) References Cited

U.S. PATENT DOCUMENTS
6,661,457 B1    12/2003    Mathur et al.
(Continued)

FOREIGN PATENT DOCUMENTS
EP          0 917 358 A1    5/1999
(Continued)

OTHER PUBLICATIONS
U.S. Appl. No. 11/690,364, filed Mar. 23, 2007, Iida, et al.
(Continued)

*Primary Examiner* — Sinh Tran
*Assistant Examiner* — Christopher K Peterson
(74) *Attorney, Agent, or Firm* — Oblon, Spivak, McClelland, Maier & Neustadt, L.L.P.

(57) ABSTRACT

A solid-state image sensor has a plurality of pixels, a read-out circuit and a signal processing section. The plurality of pixels includes a plurality of first pixels, a plurality of second pixels, a plurality of third pixels and a plurality of fourth pixels. The signal processing section includes a color acquisition section, a first judgment section configured to determine whether or not the white data value W in the target pixel block is smaller than a predetermined first set value, and a white color correction section configured to perform correction processing of the white color data value W in the target pixel block based on the following Expression (1) when the judgment result of the first judgment section is NO, and to output the white data value W by itself without performing the correction processing based on the Expression (1) when the judgment result of the first determination section is YES;

$$W'=S_1C_1+S_2C_2+S_3C_3 \quad (1)$$

where each of $S_1$, $S_2$, and $S_3$ is a coefficient that is determined based on a color balance.

7 Claims, 20 Drawing Sheets

U.S. PATENT DOCUMENTS

| | | |
|---|---|---|
| 6,757,012 B1 | 6/2004 | Hubina et al. |
| 6,781,626 B1 | 8/2004 | Wang |
| 6,876,384 B1 | 4/2005 | Hubina et al. |
| 7,400,332 B2 * | 7/2008 | Schweng et al. .............. 345/589 |
| 2003/0197799 A1 * | 10/2003 | Dyas et al. .................... 348/308 |
| 2005/0122409 A1 | 6/2005 | Takeshita |
| 2005/0276475 A1 | 12/2005 | Sawada |
| 2006/0177129 A1 * | 8/2006 | Matsuyama .................. 382/167 |
| 2007/0091055 A1 * | 4/2007 | Sakuda ......................... 345/102 |
| 2007/0145273 A1 * | 6/2007 | Chang ......................... 250/338.1 |
| 2008/0012969 A1 * | 1/2008 | Kasai et al. ................... 348/266 |

FOREIGN PATENT DOCUMENTS

| | | |
|---|---|---|
| EP | 1 014 695 A2 | 6/2000 |
| JP | 11-252464 | 9/1999 |
| JP | 2004-304706 | 10/2004 |
| JP | 2005-6066 | 1/2005 |
| JP | 2005-295381 | 10/2005 |

OTHER PUBLICATIONS

U.S. Appl. No. 12/019,191, filed Jan. 24, 2008, Egawa, et al.
U.S. Appl. No. 12/123,816, filed May 20, 2008, Egawa.
U.S. Appl. No. 12/134,680, filed Jun. 6, 2008, Egawa.
U.S. Appl. No. 12/019,173, filed Jan. 24, 2008, Egawa.
U.S. Appl. No. 11/967,585, filed Dec. 31, 2007, Egawa, et al.
Taiwanese Office Action issued Nov. 16, 2010, in Patent Application No. 096121383 (with English-language translation).

* cited by examiner

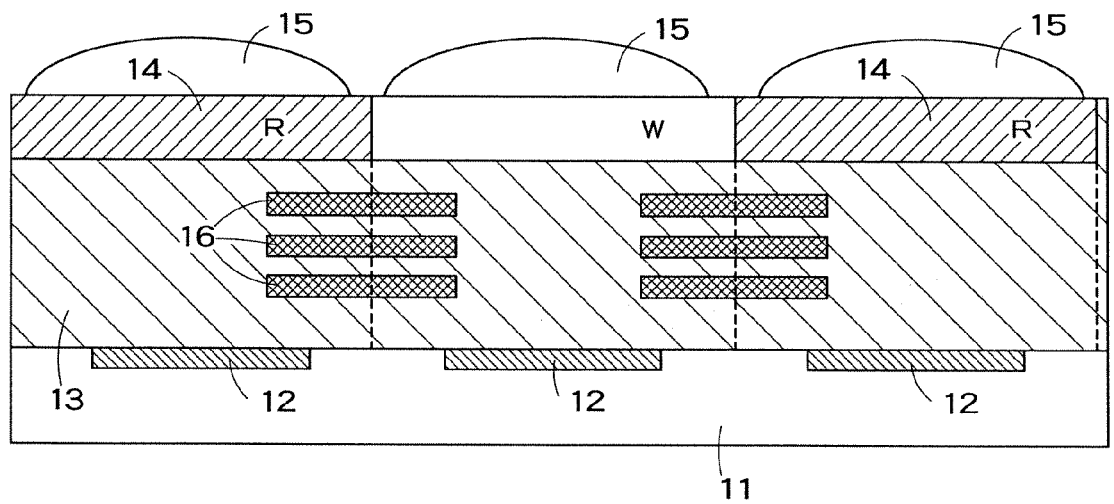
F I G. 6A
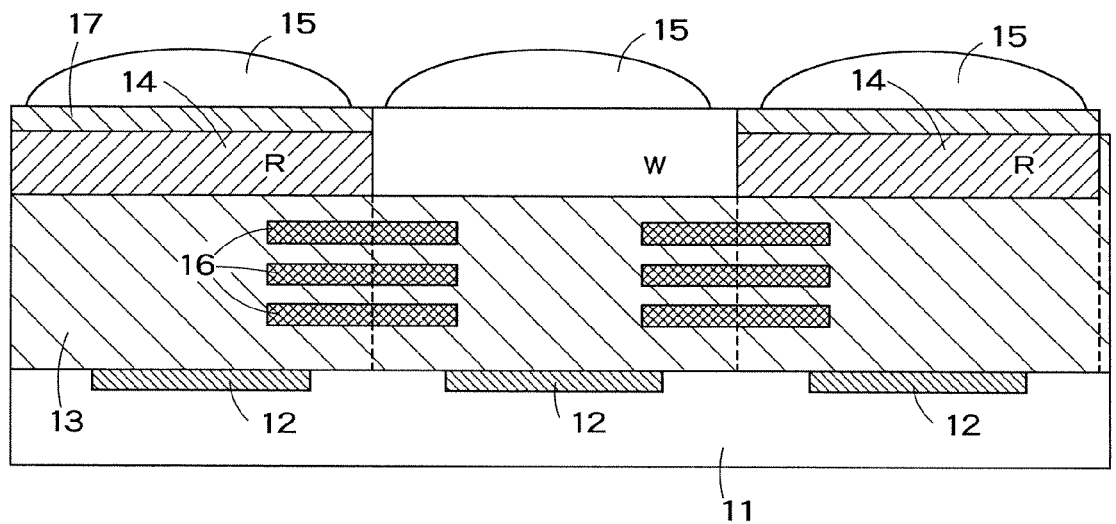
F I G. 6B

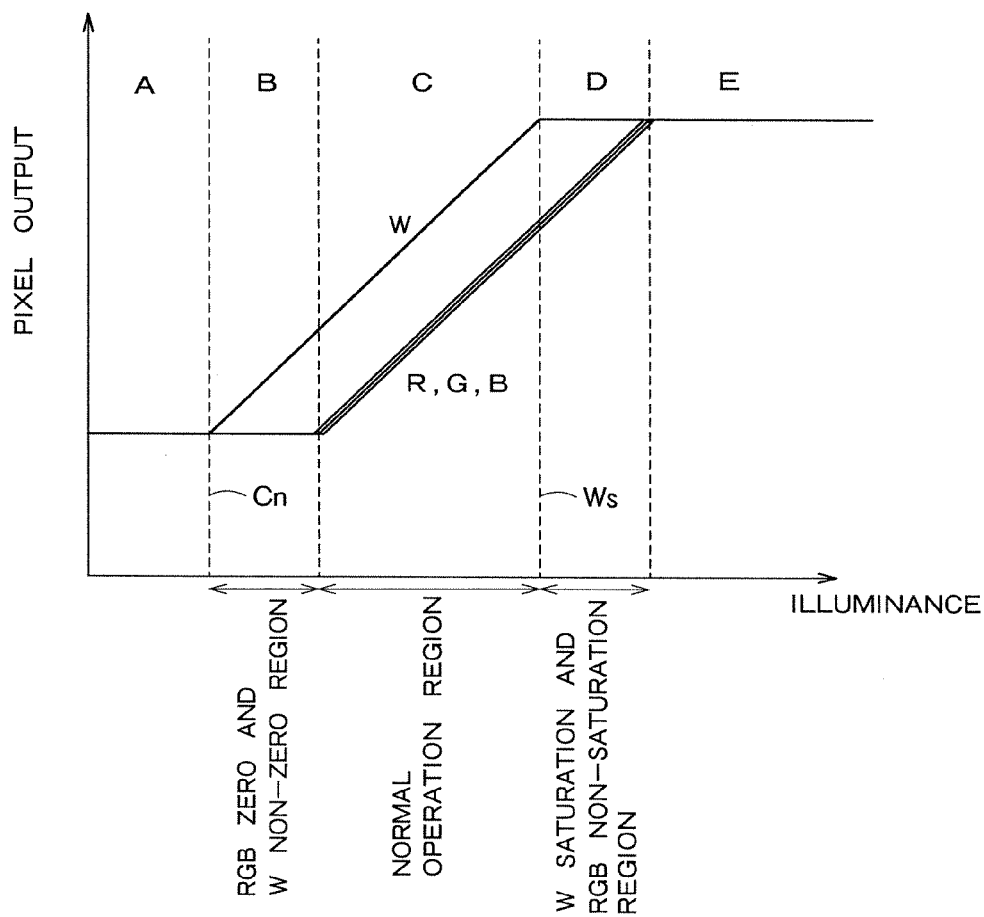
F I G. 9
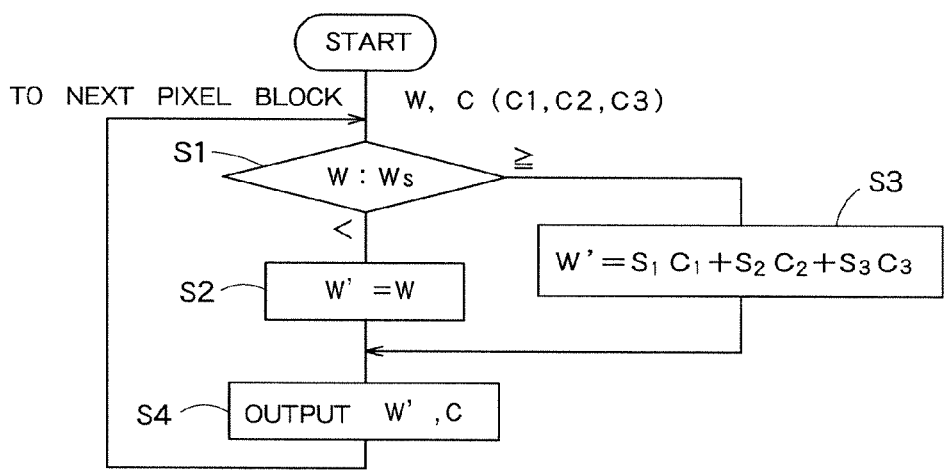
F I G. 10

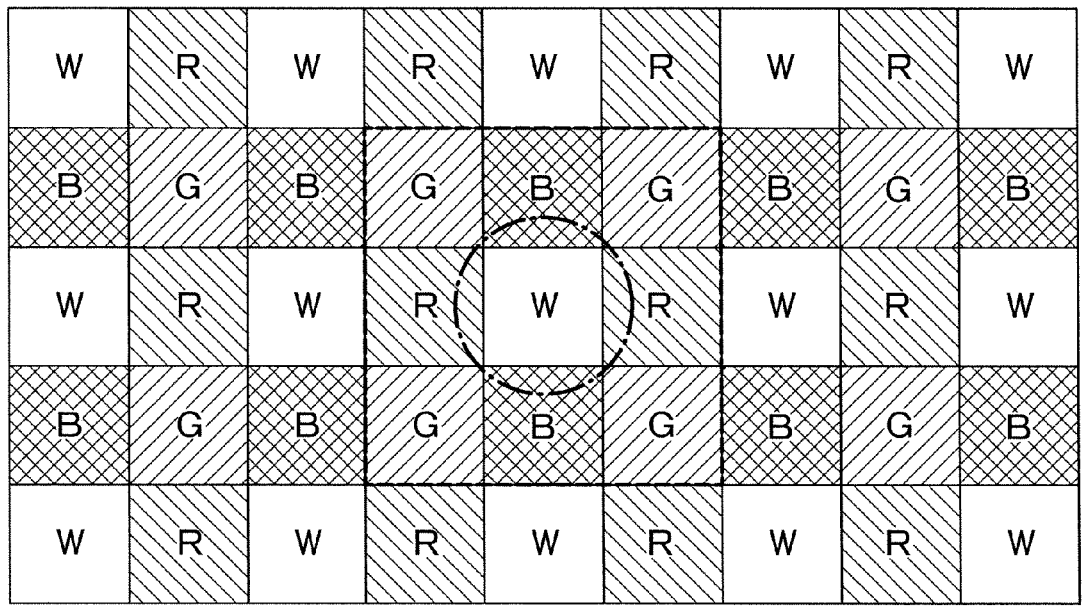
F I G. 13
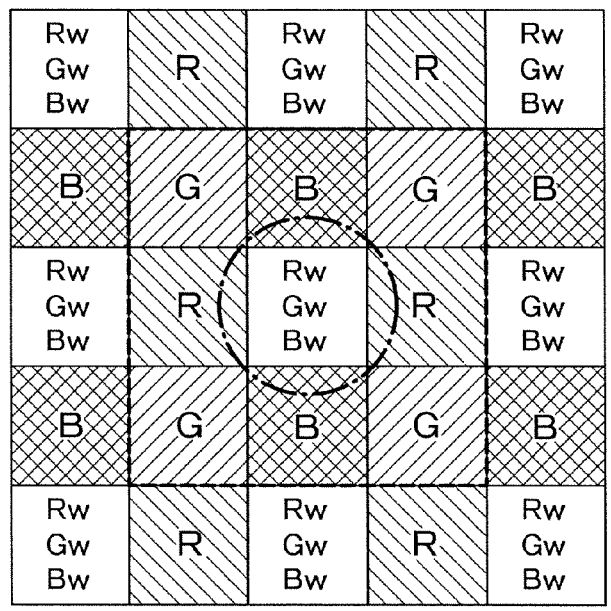
F I G. 14

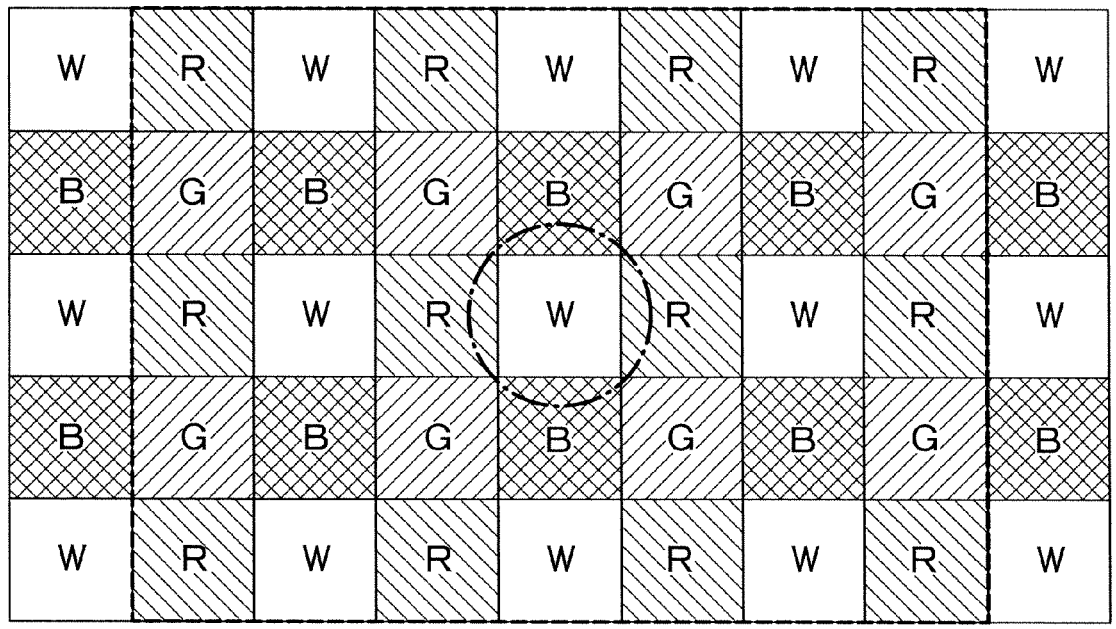
F I G. 15
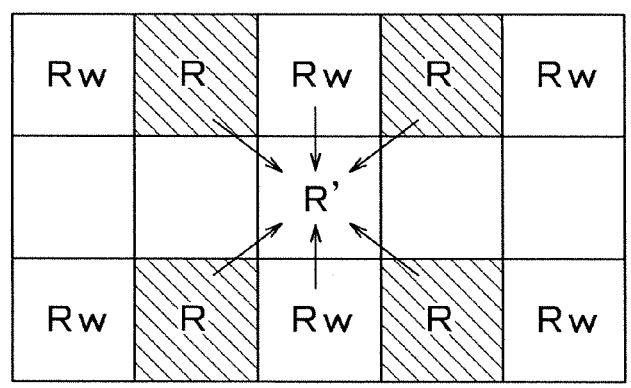
F I G. 16

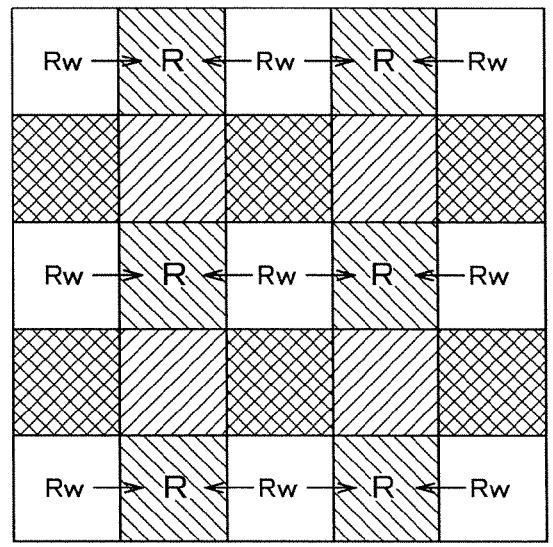
F I G. 21A
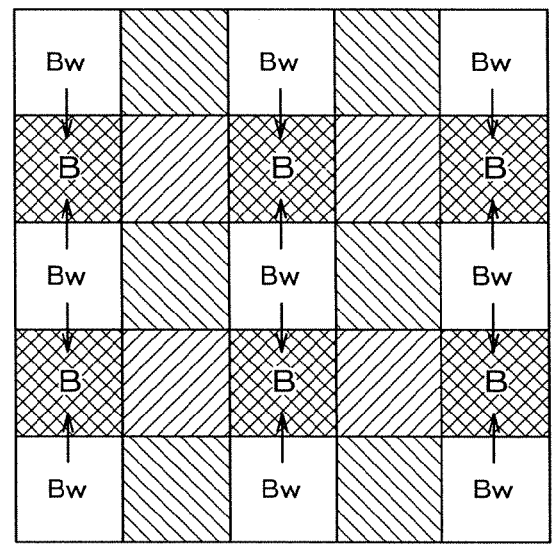
F I G. 21B
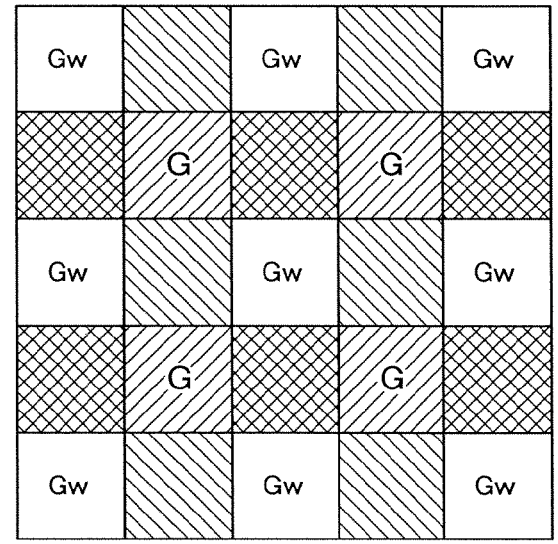
F I G. 21C

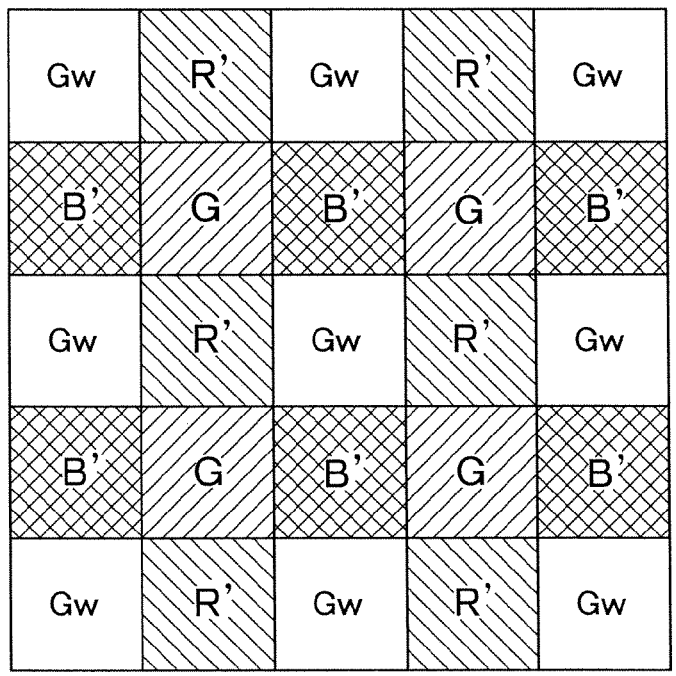
F I G. 22
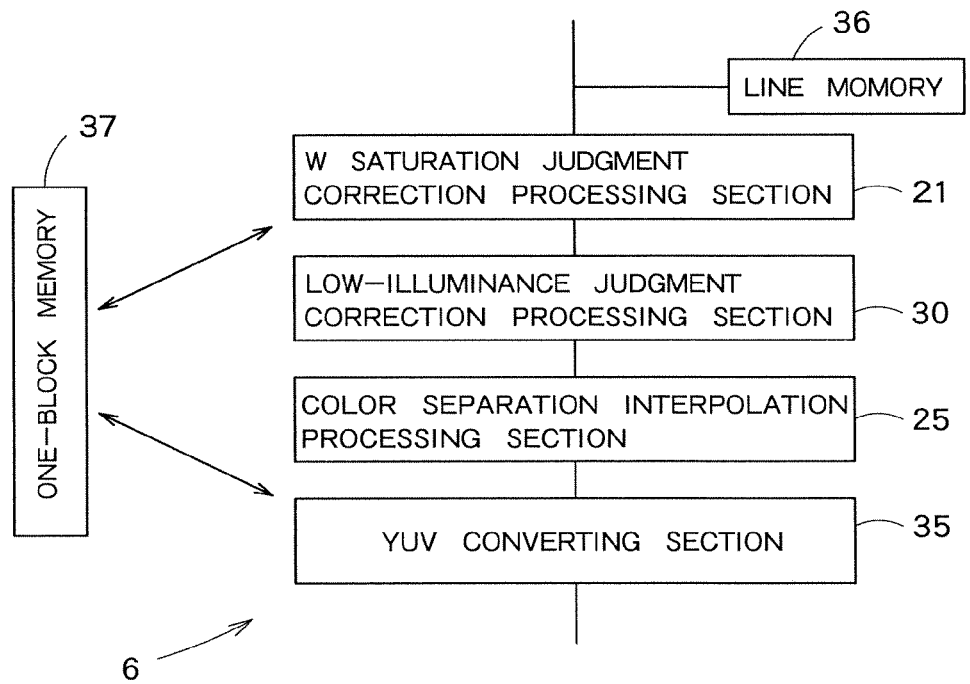
F I G. 23

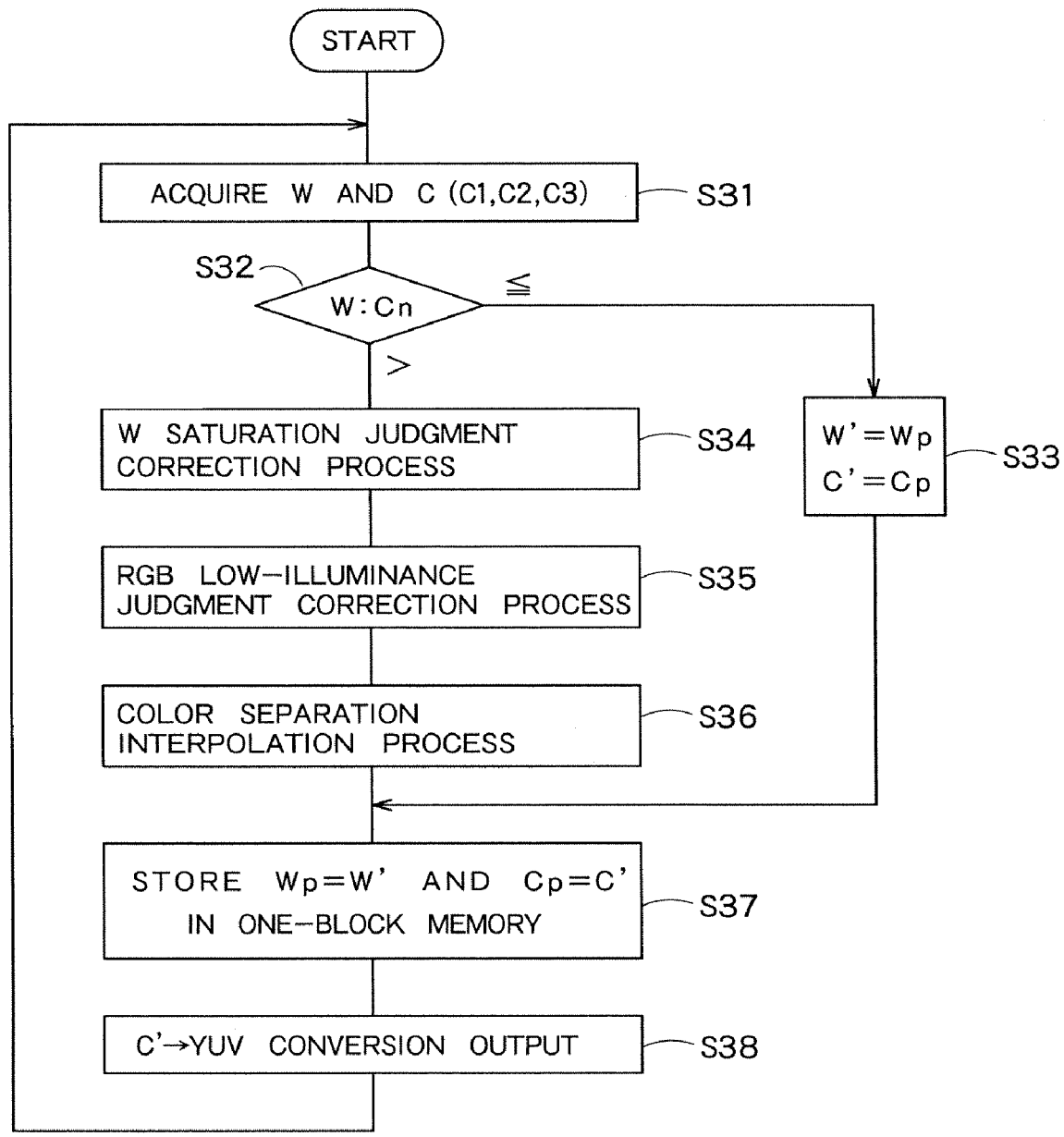
F I G. 24

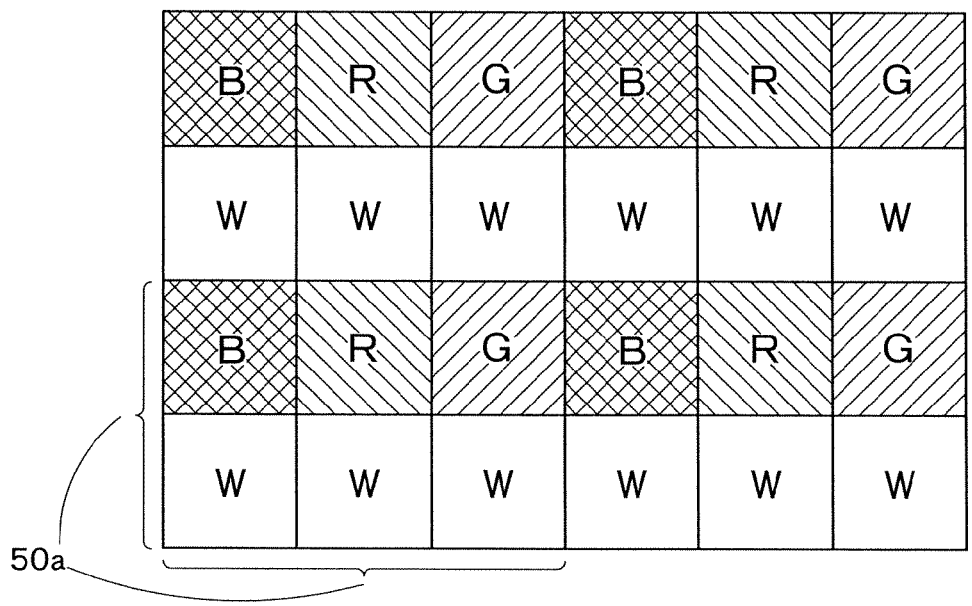
F I G. 28
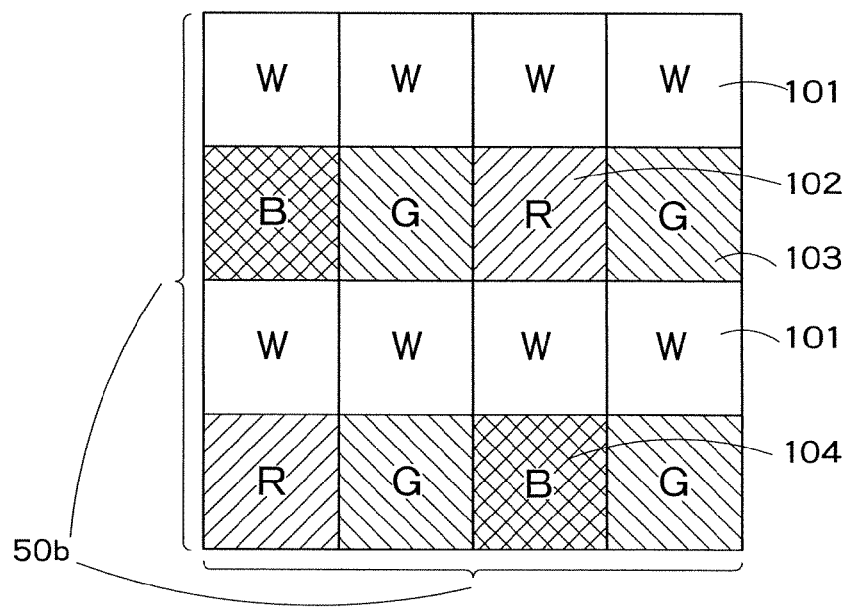
F I G. 29

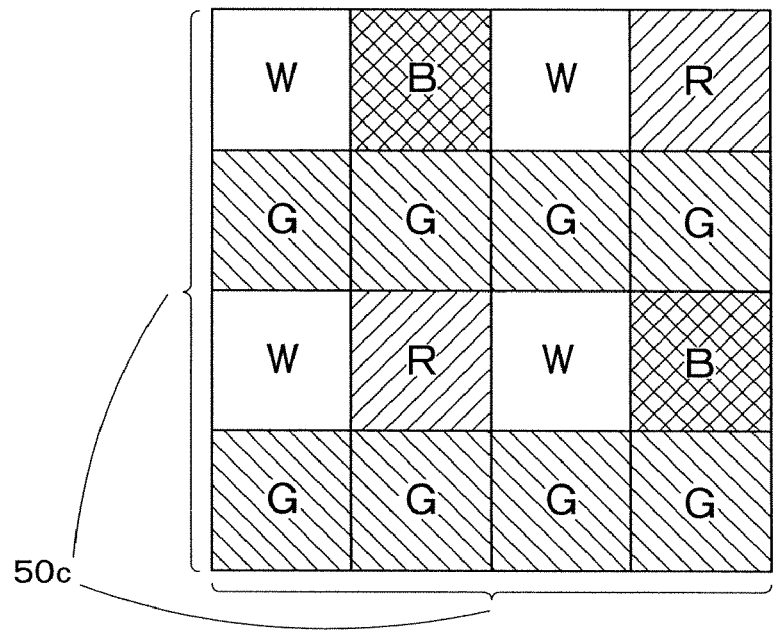
F I G. 30
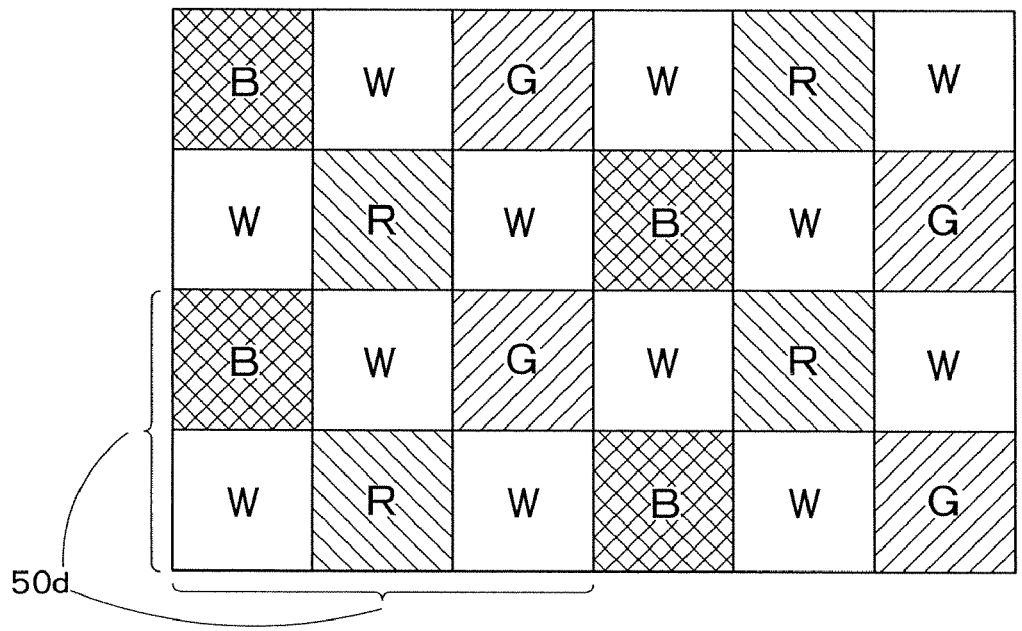
F I G. 31

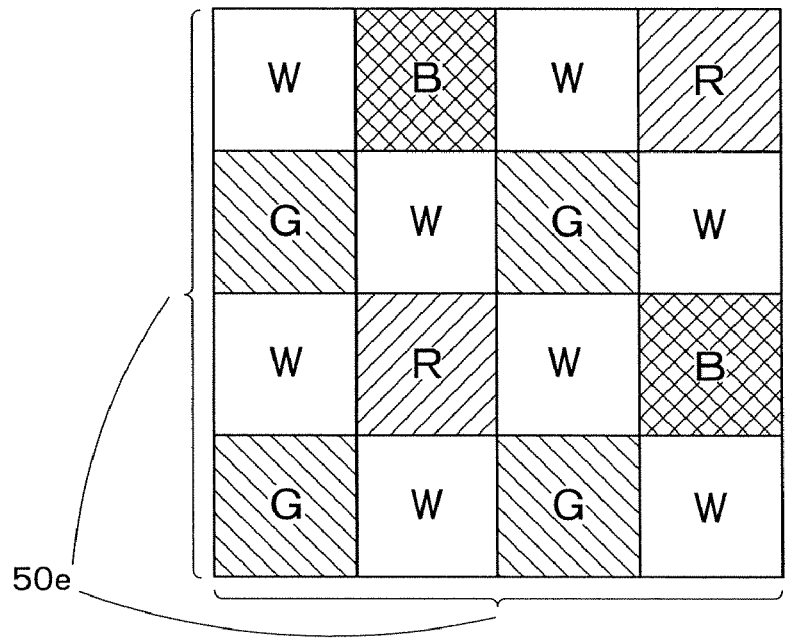
F I G. 32
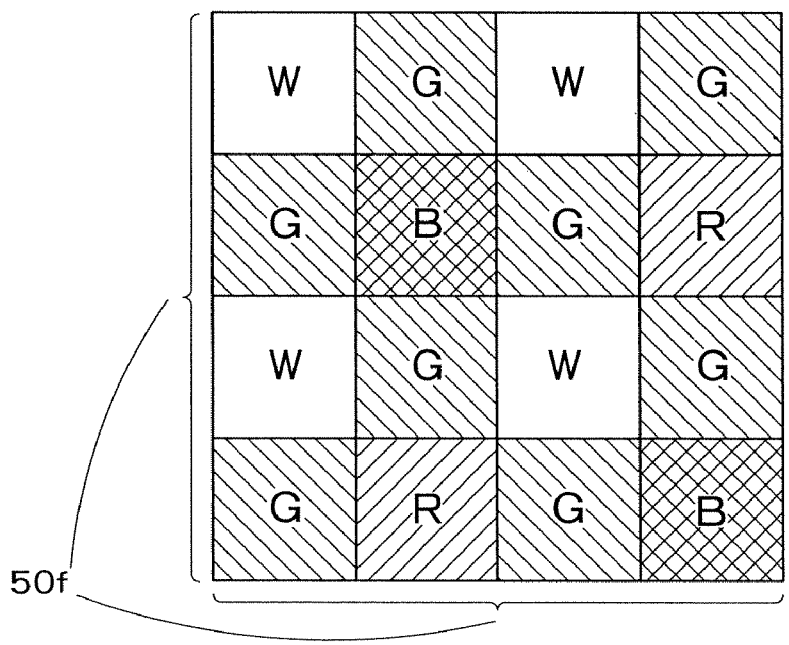
F I G. 33

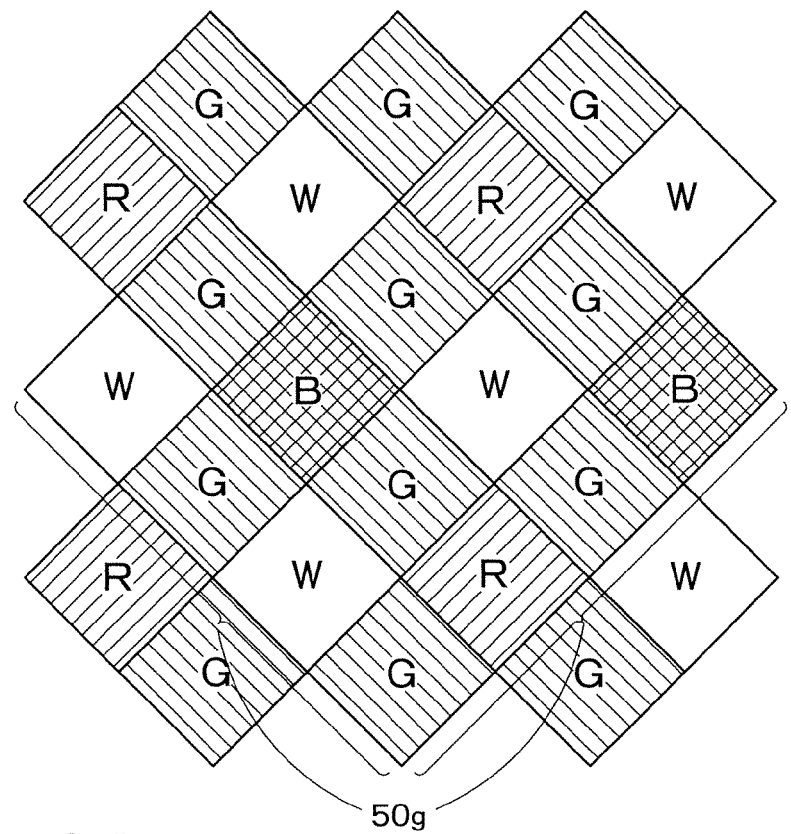
F I G. 34
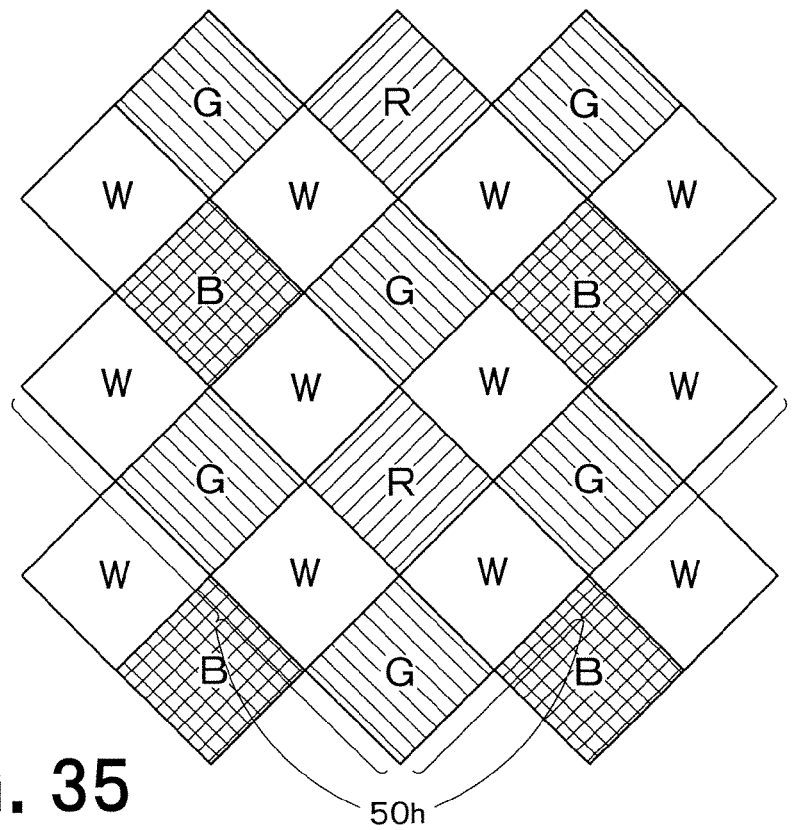
F I G. 35

US 7,990,447 B2

SOLID-STATE IMAGE SENSOR

CROSS REFERENCE TO RELATED APPLICATIONS

This application is based upon and claims the benefit of priority from the prior Japanese Patent Application No. 2006-165053, filed on Jun. 14, 2006 and Japanese Patent Application No. 2007-16971, filed on Jan. 26, 2007, the entire contents of which are incorporated herein by reference.

BACKGROUND OF THE INVENTION

1. Field of the Invention

The present invention relates to a solid-state image sensor in which a plurality of pixels each having a photoelectric converting element are arranged in a matrix form.

2. Related Art

In recent years, MOS (CMOS) image sensors have been actively developed. In particular, with miniaturization (a reduction in design rules) of a semiconductor process, single-plate color image sensors each having 5 million or more pixels at a pixel pitch of, e.g., 2.5 µm have been commercialized.

This type of MOS image sensor generally includes a color filter having a Bayer arrangement where one red (R) pixel, one blue B pixel, and two diagonally arranged green (G) pixels are provided in a pixel block formed of 2 rows and two columns. The reason why two pixels G are provided in the pixel block is that a photoelectric converting element has a high sensitivity with respect to green. Therefore, the green pixel is used as a pixel that acquires luminance (brightness) information.

With tendencies of an increase in pixels and miniaturization of pixels involved by a reduction in design rules of a semiconductor device, a need for realizing a wide dynamic range (WDR) has been increased. In recent years, various technologies have been proposed to avoid saturation on a high-illuminance side in particular. However, an expansion of a dynamic range toward a low-illuminance side, i.e., a reduction in a minimum object illuminance requires an improvement in an SNR on each pixel, and realization is difficult. A trend in miniaturization of pixels proceeds to a level of 1.7 µm in terms of a pixel size and 1 µm or below in terms of an aperture area. When such a pixel size is adopted, a fluctuation in incident light becomes prominent, and an amount of incident light is rapidly decreased beyond a reduction ratio of a pixel area due to image blurring (a diffraction limit). Therefore, a measure of expanding a dynamic range toward a low-illuminance side, i.e., improving an SNR is required.

Various kinds of technologies that can suppress deterioration in color reproducibility even if a pixel size is reduced have been proposed (see, e.g., JP-A 2004-304706 (KOKAI) and JP-A 9358/1996 (KOKAI)).

JP-A 2004-304706 (KOKAI) discloses a technology of arranging a white color used as a luminance signal in right, left, up and down directions with a green color being set at the center, thereby assuring a quantity of signal electric charges of the luminance signal. In case of JP-A 2004-304706 (KOKAI), a pixel block formed of four rows and four columns is judged as a unit, and there is a problem that it takes much time for the signal processing since the pixel block unit is large. Further, special signal processing is not carried out with respect to a pixel having a low luminance, and hence the pixel having the low luminance may be submerged in noise.

Furthermore, JP-A 9358/1996 discloses a technology of performing signal processing for alignment of color filters in such a manner that a sum total of spectral sensitivities of all pixels becomes R:G:B=2:3:1. However, even in case of JP-A 9358/1996, a pixel having a low illuminance is not taken into consideration. Therefore, an SNR of the pixel having the low luminance may be deteriorated.

SUMMARY OF THE INVENTION

The present invention has been developed in view of the above problems, and it is an object of the present invention to provide a solid-state image sensor that can output a picture signal superior in color reproducibility.

According to one embodiment of the present invention, a solid-state image sensor, comprising:

a plurality of pixels which are formed in matrix form on a semiconductor substrate, each pixel having a photoelectric converting element which outputs an electric signal obtained by photoelectric conversion;

a read-out circuit configured to read out the electric signals outputted from the plurality of pixels; and a signal processing section configured to perform signal processing with respect to the electric signals read out from the read-out circuit, wherein the plurality of pixels includes:

a plurality of first pixels which leads incident light of a visible light wavelength to a corresponding photoelectric conversion element via a transparent layer;

a plurality of second pixels, each having a first color filter having a higher transmissivity with respect to a first visible light wavelength band in a visible light wavelength band, as compared with the other visible light wavelength band;

a plurality of third pixels, each having a second color filter having a higher transmissivity with respect to a second visible light wavelength band different from the first visible light wavelength band in a visible light wavelength band, as compared with the other visible light wavelength band; and a plurality of fourth pixels, each having a third color filter having a higher transmissivity with respect to a third visible light wavelength band different from the first and second visible light wavelength bands in a visible light wavelength band, as compared with the other visible light wavelength band, wherein the signal processing section includes:

a color acquisition section configured to acquire a first color data value $C_1$, a second color data value $C_2$, a third color data value $C_3$ and a white color data value W in a target pixel block including a plurality of pixels to perform signal process;

a first judgment section configured to determine whether or not the white data value W in the target pixel block is smaller than a predetermined first set value; and a white color correction section configured to perform correction processing of the white color data value W in the target pixel block based on the following Expression (1) when the judgment result of the first judgment section is NO, and to output the white data value W by itself without performing the correction processing based on the Expression (1) when the judgment result of the first determination section is YES;

$$W' = S_1 C_1 + S_2 C_2 + S_3 C_3 \quad (1)$$

where each of $S_1$, $S_2$, and $S_3$ is a coefficient that is determined based on a color balance.

Furthermore, according to one embodiment of the present invention, a solid-state image sensor, comprising:

a plurality of pixels which are formed in matrix form on a semiconductor substrate, each pixel having a photoelectric converting element which outputs an electric signal obtained by photoelectric conversion;

a read-out circuit configured to read out the electric signals outputted from the plurality of pixels; and a signal processing section configured to perform signal processing with respect to the electric signals read out from the read-out circuit, wherein the plurality of pixels includes:

a plurality of first pixels which leads incident light of a visible light wavelength to a corresponding photoelectric conversion element via a transparent layer;

a plurality of second pixels, each having a first color filter having a higher transmissivity with respect to a first visible light wavelength band in a visible light wavelength band, as compared with the other visible light wavelength band;

a plurality of third pixels, each having a second color filter having a higher transmissivity with respect to a second visible light wavelength band different from the first visible light wavelength band in a visible light wavelength band, as compared with the other visible light wavelength band; and a plurality of fourth pixels, each having a third color filter having a higher transmissivity with respect to a third visible light wavelength band different from the first and second visible light wavelength bands in a visible light wavelength band, as compared with the other visible light wavelength band, wherein the signal processing section includes:

a color acquisition section configured to acquire a first color data value $C_1$, a second color data value $C_2$, a third color data value $C_3$ and a white color data value W in a target pixel block including a plurality of pixels to perform signal process;

a color separation processing section configured to separate the white data value into a plurality of colors based on the following Expressions (2) to (4) to generate the first color data value $C1_W$ of a first color, the second color data value $C2_W$ of a second color and the third color data value $C3_W$ of a third color;

$$C1_W \leftarrow W \cdot K_1 \quad (2)$$

$$C2_W \leftarrow W \cdot K_2 \quad (3)$$

$$C3_W \leftarrow W \cdot K_3 \quad (4)$$

where $K_1$, $K_2$, and $K_3$ indicate color ratios, and are determined by the color data values $C_1$, $C_2$ and $C_3$.

Furthermore, according to one embodiment of the present invention, a solid-state image sensor, comprising:

a plurality of pixels which are formed in matrix form on a semiconductor substrate, each pixel having a photoelectric converting element which outputs an electric signal obtained by photoelectric conversion;

a read-out circuit configured to read out the electric signals outputted from the plurality of pixels; and a signal processing section configured to perform signal processing with respect to the electric signals read out from the read-out circuit, wherein the plurality of pixels includes:

a plurality of first pixels which leads incident light of a visible light wavelength to a corresponding photoelectric conversion element via a transparent layer;

a plurality of second pixels, each having a first color filter having a higher transmissivity with respect to a first visible light wavelength band in a visible light wavelength band, as compared with the other visible light wavelength;

a plurality of third pixels, each having a second color filter having a higher transmissivity with respect to a second visible light wavelength band different from the first visible light wavelength band in a visible light wavelength band, as compared with the other visible light wavelength; and a plurality of fourth pixels, each having a third color filter having a higher transmissivity with respect to a third visible light wavelength band different from the first and second visible light wavelength bands in a visible light wavelength band, as compared with the other visible light wavelength, wherein the signal processing section includes:

a color acquisition section configured to acquire a first color data value $C_1$ of first color, a second color data value $C_2$ of second color, a third color data value $C_3$ of third color and a white color data value W in a target pixel block including a plurality of pixels to perform signal process;

a judgment section configured to judge whether the color data values $C_1$, $C_2$ and $C_3$ are smaller than a predetermined set value; and a low-illuminance correction section configured to retrieve the color data value judged to be smaller than the set value based on the white color data value and the color data value larger than the set value when two larger values among the color data values $C_1$, $C_2$ and $C_3$ are judged to be smaller than the set value.

Furthermore, according to one embodiment of the present invention, a solid-state image sensor, comprising:

a plurality of pixels which are formed in matrix form on a semiconductor substrate, each pixel having a photoelectric converting element which outputs an electric signal obtained by photoelectric conversion; and a read-out circuit configured to read out the electric signals outputted from the plurality of pixels, wherein the plurality of pixels are sorted out into a plurality of pixel blocks in units of two or more pixels; and the plurality of pixels is in a square shape slanted by 45° with respect to two axes of image pick-up surface, the neighboring pixels being arranged without placing any space, the first and fourth pixels being arranged along a row different from each other.

BRIEF DESCRIPTION OF THE DRAWINGS

FIG. 6A is a cross-sectional view schematically showing a cross-sectional configuration corresponding to three pixels that are adjacent to each other in a row direction and is also a cross-sectional view of a solid-state image sensor having an infrared cut filter, and FIG. 6B is a cross-sectional view showing an example where an infrared cut filter 17 is arranged on each color filter with respect to FIG. 6A;

FIG. 9 is a view showing a relationship between a luminance and a pixel output;

FIG. 10 is a flowchart showing an example of a processing operation performed by the signal processing circuit 6 according to the first embodiment;

FIG. 13 is a view for explaining a processing operation at a step S11 in FIG. 12;

FIG. 14 is a view for explaining the processing operation at the step S11 in FIG. 12;

FIG. 15 is a view showing an example of a pixel block formed of five rows and seven columns having a pixel W at the center;

FIG. 16 is a view for explaining a processing operation of an interpolation processing section;

FIGS. 21A to C are views for explaining a processing operation of an interpolation processing section;

FIG. 22 is a view showing a signal matrix processed to cope with a Bayer arrangement;

FIG. 23 is a block diagram showing an example of an internal configuration of a signal processing circuit 6 according to a sixth embodiment;

FIG. 24 is a flowchart showing an example of a processing operation performed by the signal processing circuit 6 depicted in FIG. 23;

FIG. 28 is a view showing an example of the pixel array 1 in which each line formed of pixels W alone is provided every other row;

FIG. 29 is a view showing an example of a pixel block 10b in which the pixel arrangement depicted in FIG. 28 is partially changed;

FIG. 30 is a view showing an example of a pixel block 10c in which the pixel arrangement depicted in FIG. 29 is partially changed;

FIG. 31 is a view showing a pixel array 1 according to a 10th Embodiment;

FIG. 32 is a view showing a pixel array 1 in which the pixel arrangement depicted in FIG. 31 is partially changed;

FIG. 33 is a view showing a pixel array 1 in which the pixels W and pixels G depicted in FIG. 32 are counterchanged;

FIG. 34 is a view showing a pixel array 1 according to an 11th Embodiment;

FIG. 35 is a view showing a pixel array 1 according to a modification of FIG. 34.

DETAILED DESCRIPTION OF THE INVENTION

Embodiments according to the present invention will now be explained with reference to the accompanying drawings.

First Embodiment

Figure 1:
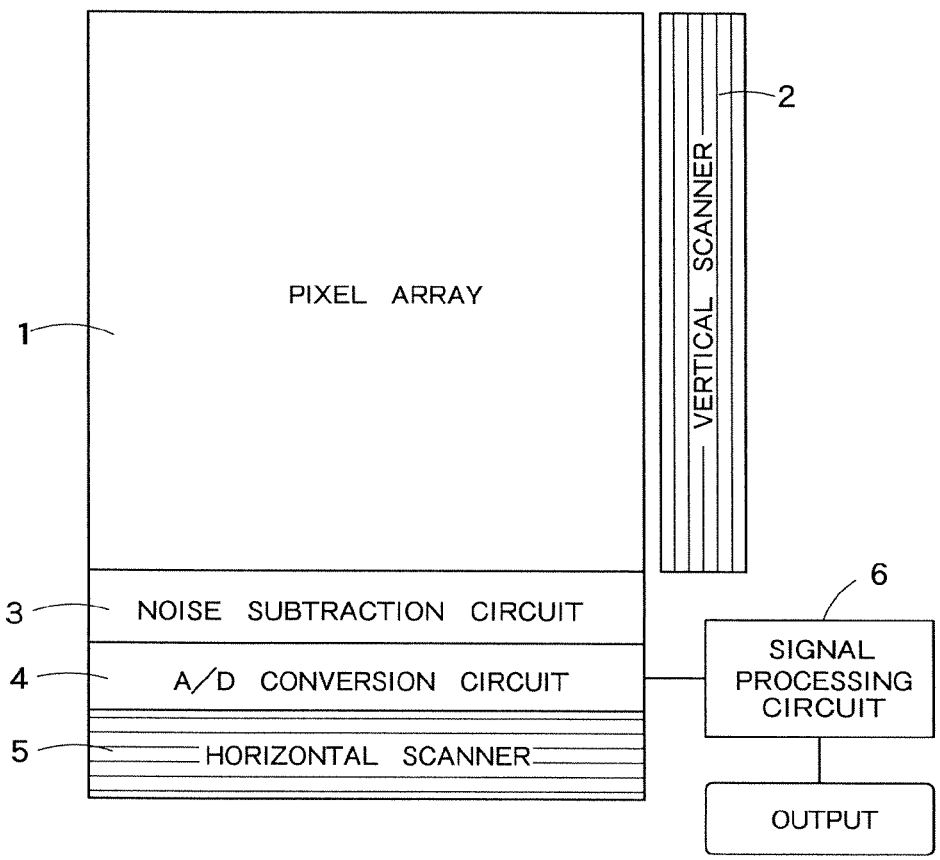
FIG. 1 is a block diagram showing a schematic configuration of a solid-state image sensor according to an embodiment of the present invention.

FIG. 1 is a block diagram showing a schematic configuration of a solid-state image sensor according to an embodiment of the present invention. The solid-state image sensor depicted in FIG. 1 includes a pixel array 1 in which a plurality of pixels each having a photoelectric converting element are arranged in a matrix form, a vertical scanner 2 that sequentially supplies a driving voltage to respective rows in the pixel array 1, a noise subtraction circuit 3 that performs processing to remove noise included in an imaging signal subjected to photoelectric conversion in each pixel, an A/D conversion circuit 4 that performs A/D conversion on the imaging signal output from the noise subtraction circuit 3, a horizontal scanner 5 that sequentially selects and reads A/D-converted imaging data in accordance with each column, and a signal processing circuit 6 that performs later-explained signal processing to the imaging data.

The signal processing circuit 6 receives imaging data for each column in series in accordance with each row in the pixel array 1. The vertical scanner 2, the noise subtraction circuit 3, the A/D conversion circuit 4, and the horizontal scanner 5 correspond to a read-out circuit. The read-out circuit simultaneously reads signals in one horizontal line with respect to a plurality of pixels or sequentially reads signals in accordance with each pixel.

The read-out circuit and the pixel array 1 are formed on the same semiconductor substrate. The signal processing circuit may be also formed on the same semiconductor substrate. Otherwise the signal processing circuit 6 may be formed on a semiconductor substrate different from the semiconductor substrate on which the read-out circuit and the pixel array 1 are formed. In this case, the output of the read-out circuit is inputted to the signal processing circuit 6 on the other semiconductor substrate.

Figure 2:
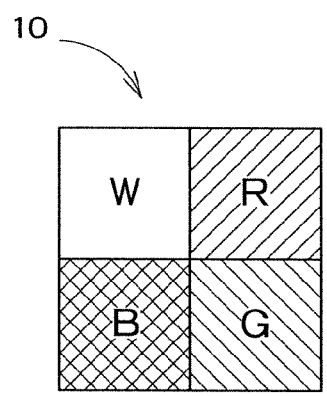
FIG. 2 is a view showing an example of a pixel block 100 formed of two rows and two columns.

The plurality of pixels in the pixel array 1 are divided into a plurality of pixel blocks with some pixels arranged to be adjacent to each other being judged as a unit. For example, FIG. 2 is a view showing an example of a pixel block formed of two rows and two columns, and a pixel of a white color W (which will be referred to as a pixel W hereinafter) and a pixel of a green color G (which will be referred to as a pixel G hereinafter) are diagonally arranged, and remaining two pixels include a red color R and a blue color B (which will be referred to as a pixel R and a pixel B hereinafter) are included.

The pixel W leads incident light having a visible light wavelength (e.g., 400 nm to 650 nm) to a corresponding photoelectric converting element via a transparent layer. The transparent layer is formed of a material that is transparent with respect to visible light, and demonstrates a high sensitivity in an entire visible light region.

On the other hand, a color filter having a high transmissivity with respect to light in a visible light wavelength band of a green color is provided to the pixel G. A color filter having a high transmissivity with respect to light in a visible light wavelength band of a red color is provided to the pixel R. A color filter having a high transmissivity with respect to light in a visible light wavelength band of a blue color is provided to the pixel B.

The pixel W is provided because a white pixel transmits light in the entire visible light wavelength band therethrough, and hence the pixel W is suitable for acquiring luminance information. Since the green pixel can be also utilized to acquire luminance information, the white pixel and the green pixel are diagonally arranged in FIG. 2. As a result, luminance information can be evenly detected with respect to all rows and all columns, thereby improving a luminance resolution.

Moreover, the pixel block depicted in FIG. 2 has pixels of R, G, and B besides the pixel W because R, G, and B are primary colors, superior to a pixel of a complementary color in color reproducibility, and do not require processing such as color conversion, thereby simplifying a processing procedure of signal processing.

Figure 3:
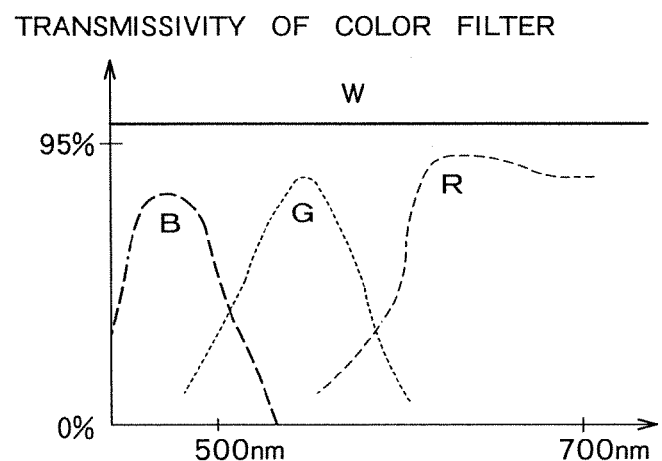
FIG. 3 is a graph showing a transmissivity of a color filter.
Figure 4:
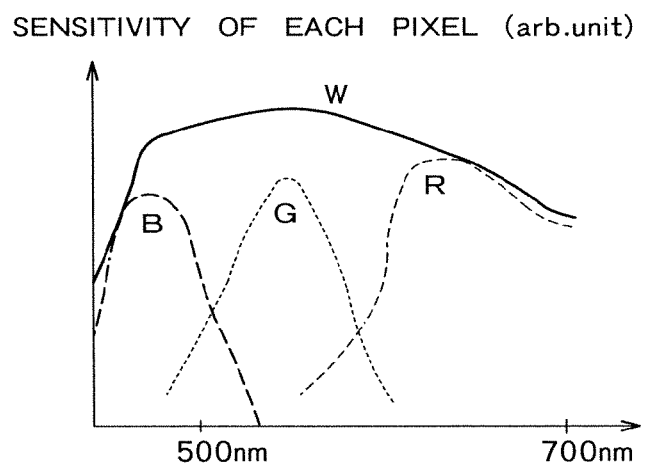
FIG. 4 is a graph showing a sensitivity of each pixel having a color filter of each color provided thereto.

FIG. 3 is a graph showing a transmissivity of each color filter, and FIG. 4 is a graph showing a sensitivity of each pixel having a color filter of each color provided thereto. As shown in FIG. 3, the filter of the white color W has a transmissivity of 95% or more with respect to light in the entire visible light wavelength band (approximately 400 to 700 nm). The color filter of the green color G has a high transmissivity with respect to light of approximately 500 to 550 nm. The color filter of the red color R has a high transmissivity with respect to light in a visible light wavelength band of approximately 600 to 700 nm. The color filter of the blue color B has a high transmissivity with respect to light in a visible light wavelength band of approximately 450 to 490 nm.

As shown in FIG. 4, the sensitivity has the same characteristics as those of the transmissivity. The pixel of the white color W has a high sensitivity with respect to the entire visible light wavelength band, and the white color W has approximately double a sensitivity of each single pixel of R, G, or B.

Additionally, when the color filters are designed in such a manner that each of a cross point (a transmissivity at a point where optical spectrums cross each other) of the blue color B and the green color G and a cross point of the green G and the red R becomes approximately 50%, the optical spectrum of the green color G extracted from the white color W can have substantially the same shape as the optical spectrum of the green color G alone when extracting color signals from the white color W which will be explained later. When the cross point falls within the value range of 40 to 60%, excellent color reproducibility can be obtained. Even if the cross point falls within the range of 30 to 70%, color reproducibility on a practical level can be obtained.

Figure 5:
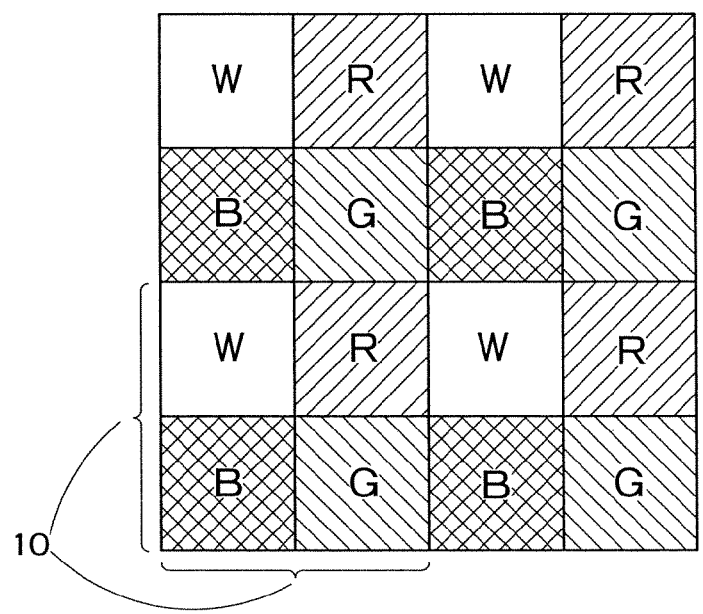
FIG. 5 is a view showing an example where a total of four pixel blocks depicted in FIG. 2 are vertically and horizontally arranged.

FIG. 5 is a view showing an example where a total of four pixel blocks depicted in FIG. 2 are vertically and horizontally arranged. Further, FIG. 6A is a cross-sectional view schematically showing a cross-sectional structure corresponding to three pixels adjacent to each other in a row direction. As shown in FIG. 6A, each pixel has a photoelectric converting element 12 formed on a semiconductor substrate 11, a color filter 14 formed on the photoelectric converting element 12 via an interlayer insulating film 13, and a micro lens 15 formed on the color filter 14. Light shielding films 16 that shield adjacent pixels against light are formed in the interlayer insulating film 13.

Since the photoelectric converting element 12 has a sensitivity in a' near-infrared wavelength region, color reproducibility is deteriorated unless near-infrared light (e.g., 650 nm or above) is cut. For example, when imaging an object that emits (reflects) pure green light and near-infrared light, the green color is detected in the pixel G, and the near-infrared light is detected in the pixel R. Therefore, the object cannot be detected as the pure green color (R:G:B)=(0:1:0).

Thus, an infrared cut filter that prevents transmission of light of 650 mm or above is provided between the solid-state image sensor and the object or between the solid-state image sensor and the lens to allow wavelength visible light alone to enter the solid-state image sensor. Alternatively, as shown in a cross-sectional view of FIG. 6B, an infrared cut filter 17 may be arranged on the color filter. In case of FIG. 6B, the infrared cut filter 17 is not provided to the white color pixel. That is because the white color pixel is provided to acquire luminance information, and luminance information on a low-luminance side can be more assuredly obtained when the infrared cut filter 17 is not provided.

Figure 7:
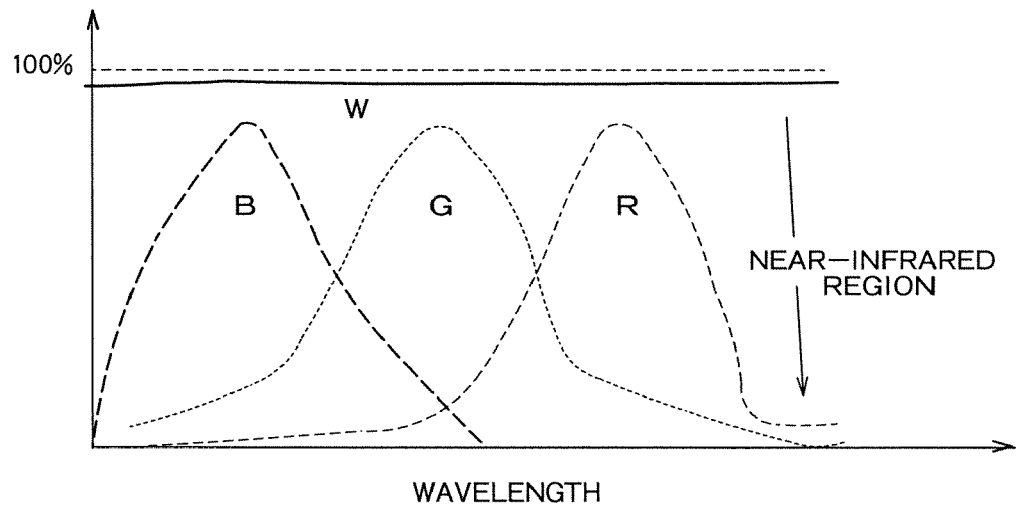
FIG. 7 is a graph showing a relationship between a transmission wavelength band and a transmissivity of each pixel when the infrared cut filter 17 is provided to each of pixels RGB but the infrared cut filter 17 is not provided to a pixel W.

FIG. 7 is a graph showing a relationship between a transmission wavelength band and a transmissivity of each pixel when the infrared cut filter 17 is provided to each of the pixels R, G, and B but the infrared cut filter 17 is not provided to the pixel W. As shown in the drawing, the pixel W can absorb a light ray having a wavelength (a near-infrared ray of approximately 1.1 μm) that can be photoelectrically converted by silicon as a substrate material of the photoelectric converting element. In particular, the pixel W is advantageous when imaging an object with a low luminance, and it can be used as a near-infrared camera.

Figure 8:
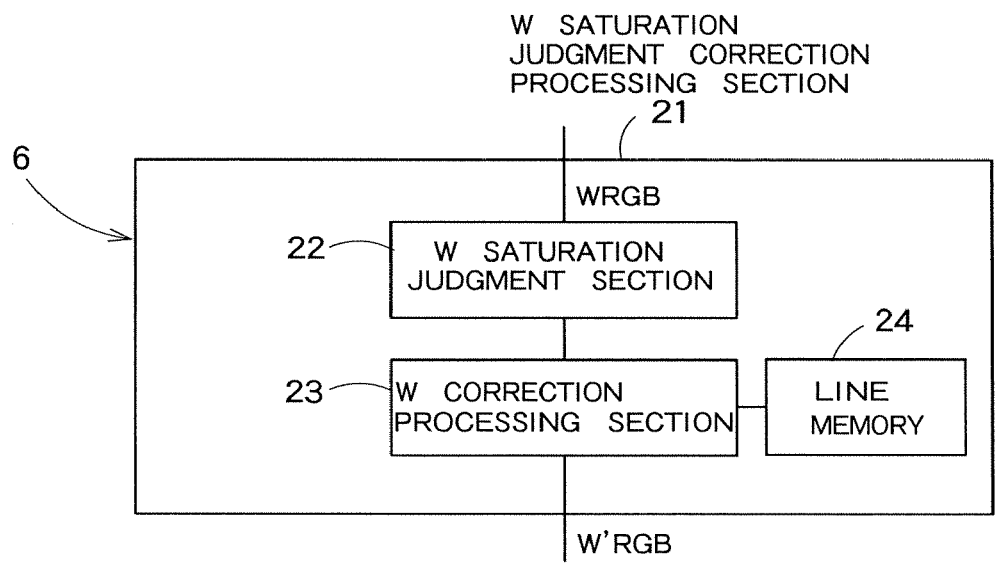
FIG. 8 is a block diagram showing an example of an internal configuration of a signal processing circuit 6 depicted in FIG. 1 according to a first embodiment.

FIG. 8 is a block diagram showing an example of an internal configuration of the signal processing circuit 6 depicted in FIG. 1. The signal processing circuit 6 depicted in FIG. 8 includes a W saturation judgment correction processing section that performs a saturation judgment and correction processing of the white color pixel. Although FIG. 8 shows the example where the W saturation judgment correction processing section 21 alone constitutes the signal processing circuit 6 in FIG. 8, another block that performs signal processing may be included in the signal processing circuit 6.

The W saturation judgment correction processing section 21 has a W saturation judgment section 22 that judges whether a white data value W of the pixel W is saturated, a W correction processing section 23 that performs correction processing of the pixel W based on a judgment result of the W saturation judgment section 22, and a line memory 24 used by the W correction processing section 23 for an operation.

The W saturation judgment correction processing section 21 divides imaging data into RGB three-color data C=($C_1$, $C_2$, $C_3$) and white data value W and performs signal processing. Each of the three-color data C and the white color data value W can take, e.g., a value of data 0 to 255 of 256 tones. In the following explanation, it is assumed that red color data is $C_1$, green color data is $C_2$, and blue color data is $C_3$. For example, when $C_2$=100 is judged and white light having a color temperature 5500 K (Kelvin) is imaged, it is assumed that W=200 and C=($C_1$, $C_2$, $C_3$)=(80, 100, 70) are achieved.

In the following explanation, a pixel block formed of three rows and three columns with the pixel W being placed at the center is a basic unit. The pixels R, G, and B and the pixel W have different degrees of luminance (brightness) that allow color data value of each pixel to be saturated.

FIG. 9 is a view showing a relationship between a luminance and a pixel output. As shown in FIG. 9, the pixel W is hard to be saturated on a low-illuminance side but easy to be saturated on a high-illuminance side as compared with pixels of R, G, and B. Thus, the W saturation judgment correction processing section 21 in FIG. 8 judges whether the white color data value W is not saturated on the high-luminance side.

FIG. 10 is a flowchart showing an example of a processing operation performed by the signal processing circuit 6 depicted in FIG. 8. First, the W saturation judgment section 22 judges whether the white color data value W is not lower than a set value Ws (e.g., Ws=240), and detects whether the white color data value W falls within a range where it is not saturated (a step S1, a first judgment section). If W<Ws is achieved (regions B to C in FIG. 9), it is judged that no saturation occurs, and W'=W is set (a step S2). In this case, the white color data value W is output as W' used for the next signal processing as it is.

On the other hand, if W≧Ws is achieved (in case of regions D to E in FIG. 9), it is judged that saturation occurs and a white color correction value W' is calculated by using the following Expression (1) (a step S3).

$$W' = S_1 C_1 + S_2 C_2 + S_3 C_3 \quad (1)$$

In this example, each of $S_1$, $S_2$, and $S_3$ is a coefficient that is judged based on a color balance. For example, when RGB information with a color temperature of 5500 K is adjusted to provide a pure white color (1:1:1), setting (S1, S2, S3)=(1.02, 0.82, 1.16) can suffice. When a signal (R, G, B)=(80, 100, 70) is obtained from imaging white light having a color temperature of 5500 K as explained above, the value of this coefficient $S_1$, $S_2$, or $S_3$ is derived in such a manner that a ratio R:G:B becomes 1:1:1 in a state where a total signal quantity (=250) is equalized. The coefficient $S_1$, $S_2$, or $S_3$ may be obtained based on an auto-white balance that is acquired after calculating a color balance of an entire imaging plane.

The W correction processing section 23 executes the processing at the steps S2 and S3. The respective pieces of RGB data $C_1$, $C_2$, $C_3$ at the step S3 are, e.g., an average signal value corresponding to two red pixels, an average signal value corresponding to four green pixels, and an average signal value corresponding to two blue pixels that are respectively present in the pixel block. Since output signals from the pixel array are usually sequentially read out, the line memory 24 that temporarily stores a signal of a precedently read row is required in order to calculate the average signal values by using signals corresponding to three rows. The W correction processing section 23 performs calculation while making reference to the line memory 24.

The W saturation judgment correction processing section 21 performs processing depicted in FIG. 10 in accordance with each pixel block. The section 21 outputs the white color data value W' and the RGB data values C corresponding to one pixel block (a step S4), and then performs the processing depicted in FIG. 10 with respect to the next pixel block.

As explained above, according to the first embodiment, since the white color data value W is corrected in real time in such a manner that the pixel W having a high sensitivity is not saturated on a high-luminance side, imaging data with excellent color reproducibility can be obtained without losing luminance information due to saturation.

Although the pixel block depicted in FIG. 2 is formed of four pixels of WRGB, an arrangement of WRGB can be arbitrarily changed as long as conditions that the pixel W and the pixel G are diagonally arranged are satisfied.

Second Embodiment

A second embodiment explained below is characterized in that a white color data value W of a pixel W is color-separated into three pieces of color data R, G, and B.

Although a solid-state image sensor according to the second embodiment is configured like the embodiment depicted in FIG. 1, the second embodiment is different from the first embodiment in a processing operation of a signal processing circuit 6. A difference from the first embodiment will be mainly explained hereinafter.

Even in the second embodiment, a pixel block formed of three rows and three columns with a pixel W being arranged at the center is judged as a basic unit for clearly explaining color separation processing. An actual basic unit of the pixel block is not restricted to a configuration of three rows and three columns.

Figure 11:
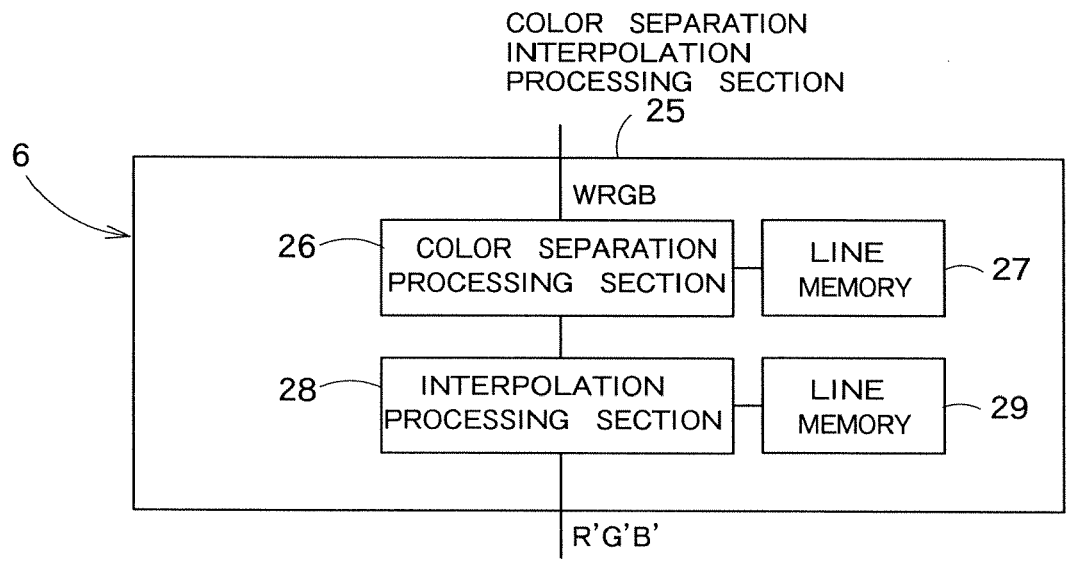
FIG. 11 is a block diagram showing an example of an internal configuration of a signal processing circuit 6 according to a second embodiment.

FIG. 11 is a block diagram showing an example of an internal configuration of the signal processing circuit 6 according to the second embodiment. The signal processing circuit 6 according to the second embodiment includes a color separation interpolation processing section 25. The color separation interpolation processing section 25 has a color separation processing section 26 that performs color separation process of a white color data value W to generate color data RGB, a line memory 27 that is used by the color separation processing section 26 for an operation, and a line memory 29 that is used by an interpolation processing section 28 for an operation to calculate an RGB signal at each pixel position by using a color-separated color data value and an original color data value. The signal processing circuit 6 may include a processing section other than the color separation interpolation processing section 25.

Figure 12:
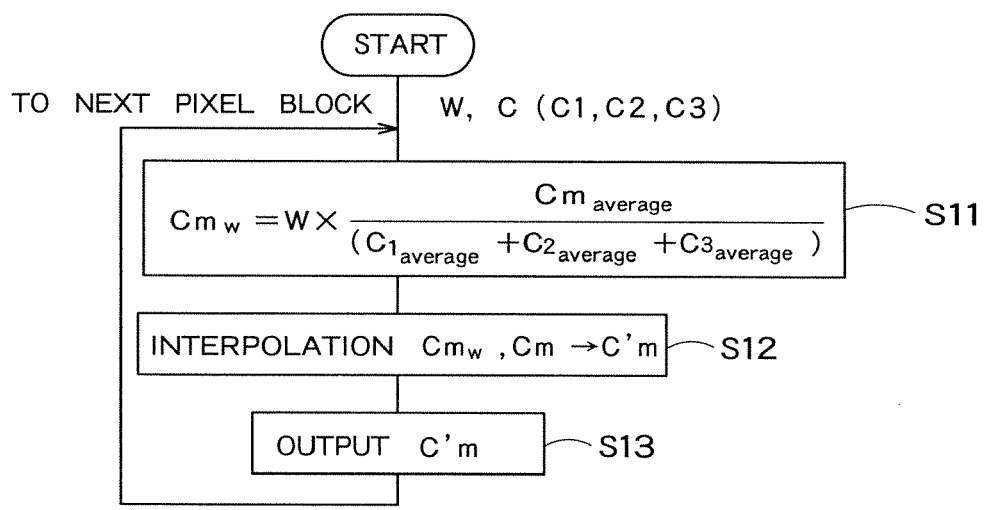
FIG. 12 is a flowchart showing an example of a processing operation performed by the signal processing circuit 6 depicted in FIG. 11.

FIG. 12 is a flowchart showing an example of a processing operation performed by the signal processing circuit 6 depicted in FIG. 11. First, the color separation processing section 26 uses pixels R, G, and B around the pixel W to convert the pixel W into the pixels R, G, and B based on the following Expressions (2) to (4) (a step S11).

$$R_W \leftarrow W \cdot K_1 \quad (2)$$

$$G_W \leftarrow W \cdot K_2 \quad (3)$$

$$B_W \leftarrow W \cdot K_3 \quad (4)$$

Here, each of $K_1$, $K_2$, and $K_3$ indicates a color ratio obtained from each pixel R, G, or B around the target pixel W, and it is represented by, e.g., the following Expressions (5) to (7).

$$K_1 = \frac{R_{average}}{(G_{average} + R_{average} + B_{average})} \quad (5)$$

$$K_2 = \frac{G_{average}}{(G_{average} + R_{average} + B_{average})} \quad (6)$$

$$K_3 = \frac{B_{average}}{(G_{average} + R_{average} + B_{average})} \quad (7)$$

Here, each of $R_{average}$, $G_{average}$, and $B_{average}$ is an average of color data values R, G, and B of a plurality of pixels around the target pixel W. For example, $R_{average}$, $G_{average}$, and $B_{average}$ are an average color data value corresponding to two red color pixels, an average color data value corresponding to four green color pixels, and an average color data value corresponding to two blue color pixels that are respectively present in the pixel block.

FIGS. 13 and 14 are views for explaining a processing operation at the step S11 in FIG. 12. As shown in FIG. 13, the color separation processing section 26 obtains the color ratios $K_1$, $K_2$, and $K_3$ in the pixel block of three rows and three columns surrounding the pixel W, and multiplies these color ratios by a luminance value of the pixel W itself (a white color data value W). As a result, it is possible to perform color separation of the pixel W without deteriorating a luminance resolution. As shown in FIG. 14, RGB data values $R_W$, $G_W$, and $B_W$ are newly generated at a position of the pixel W.

In order to execute the processing at the step S11, the color separation processing section 26 must perform an arithmetic operation for multiple rows. Thus, color data values corresponding to two rows are temporarily stored in the line memory depicted in FIG. 11, and remaining color data values corresponding to two rows stored in the line memory are read out at a timing of reading a last row in the pixel block, and the calculations represented by Expressions (2) to (4) are performed.

Here, for example, when the color data values in the pixel block are W=200 and (Raverage, Gaverage, Baverage)=(80, 100, 70), (Rw, Gw, Bw)=(64, 80, 56) can be obtained based on Expressions (2) to (7).

When the white color data value W is converted into the respective color data pieces $R_W$, $G_W$, and $B_W$ in this manner, (64+80+56)/(80+100+70)=4/5-fold is obtained with respect to the average color data $R_{average}$, $G_{average}$, and $B_{average}$. Thus, an inverse 5/4 is judged as a constant, and a value obtained by multiplying a right-hand side of each of Expressions (2) to (4) by this constant may be judged as a final color data value $R_W$, $G_W$, or $B_W$.

Each of the color conversion data $R_W$, $G_W$, and $B_W$ is obtained by multiplication and division alone using the white color data value W that essentially has a high SNR ratio and the color data value having an SNR ratio improved by averaging, and the SNR ratio of the generated color data value becomes higher than each of the R, G, and B data values.

It is to be noted that the pixel block is not restricted to three rows and three columns. For example, FIG. 15 is a view showing an example of a pixel block formed of five rows and seven columns with a pixel W being placed at the center. A capacity of the line memory that is used to perform the processing at the step S11 is dependent on the number of rows in the pixel block. The capacity of the line memory becomes large when the number of rows is increased. Therefore, extremely increasing the number of rows in the pixel block is not desirable.

When the color separation processing section 26 finishes the processing at the step S11 in FIG. 12, the interpolation processing section 28 then calculates an average value R' of all pixels R and pixels $R_W$ in the pixel block as shown in, e.g., FIG. 16. Likewise, the interpolation processing section 28 calculates an average value G' of all pixels G and pixels $G_W$ and an average value B' of all pixels B and pixels $B_W$ in the pixel block (a step S12). Each of the calculated pixel average values R', G', and B' is regarded as a color data value of a central pixel (a target pixel) in the pixel block as shown in FIG. 16.

In this manner, final color data values R', G', and B' are judged with respect to all pixels by averaging three color data values R, G, and B and the color separation data values $R_W$, $G_W$, and $B_W$ in the surrounding pixel block formed of three rows and three columns.

When the interpolation processing section 28 outputs the final color data values R', G', and B' (a step S13), the processing at the steps S11 to S13 mentioned above is performed with respect to the next pixel block.

Repeating the above-explained processing with respect to all pixel positions enables generation of the three color data values R', G', and B'. Among others, the color data values R' and B' can be obtained by performing color interpolation based on an R data value and a B data value each having a pixel number that is twofold of that in a Bayer arrangement, and an SNR ratio of each of these values is nearly doubled as compared with a conventional example.

As explained above, according to the second embodiment, since the pixel W is color-separated into three color pixels R, G, and B, apparent pixel numbers of R, G, and B can be readily and rapidly increased, and the SNR ratio can be greatly improved, thereby enhancing a picture quality. Further, since three color data values are generated with respect to all pixels based on the color interpolation processing, a color resolution is increased, thus improving a picture quality.

It is to be noted that the W saturation judgment correction processing explained in the first embodiment may be performed before performing the processing of the second embodiment.

Third Embodiment

A third embodiment is characterized in that white color data is used at a low illuminance to perform restoration processing of a color signal.

Although a solid-state image sensor according to the third embodiment has the same configuration as that depicted in FIG. 1, the third embodiment is different from the first and the second embodiments in a processing operation of a signal processing circuit 6. Differences from the first and the second embodiments will be mainly explained hereinafter.

In the third embodiment, a pixel block formed of three rows and three columns with a pixel W being placed at the center is likewise judged as a basic unit in order to facilitating understanding color separation processing, and an actual basic unit of the pixel block is not restricted to a structure formed of three rows and three columns.

Figure 17:
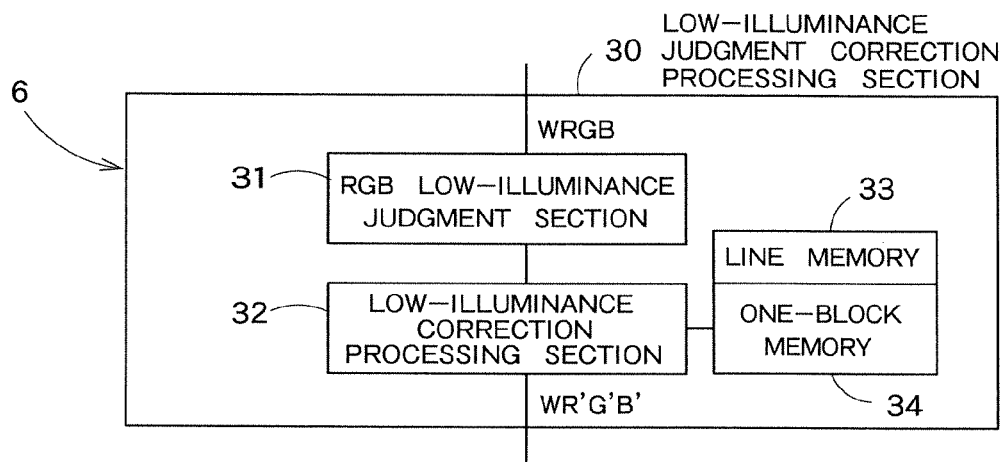
FIG. 17 is a block diagram showing an example of an internal configuration of a signal processing circuit 6 according to a third embodiment.

FIG. 17 is a block diagram showing an example of an internal configuration of a signal processing circuit 6 according to the third embodiment. The signal processing circuit 6 depicted in FIG. 17 has a low-illuminance judgment correction processing section 30. The low-illuminance judgment correction processing section 30 has an RGB low-illuminance correction section 31 that judges whether pixels R, G, and B have a low illuminance, a low-illuminance correction processing section 32 that performs correction processing when a low illuminance is judged, a line memory 33 used by the low-illuminance correction processing section 32 for an operation, and a one-block memory 34 that stores a processing result of the low-illuminance correction processing section 32 in units of pixel block. The signal processing circuit 6 may include a processing section other than the low-illuminance judgment correction processing section 30.

Figure 18:
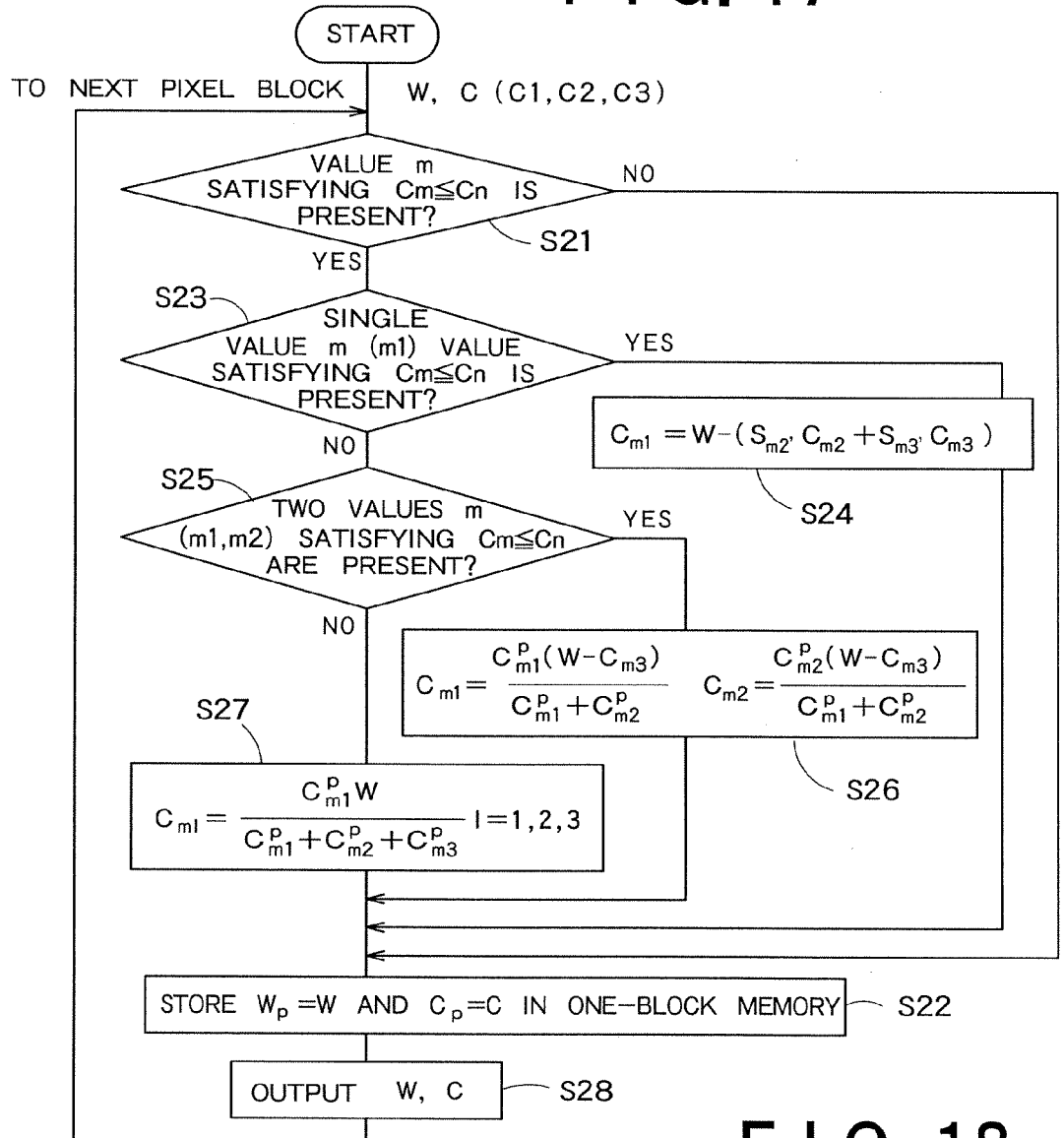
FIG. 18 is a flowchart showing an example of a processing operation performed by the signal processing circuit 6 depicted in FIG. 17.

FIG. 18 is a flowchart showing an example of a processing operation performed by the signal processing circuit 6. The RGB low-illuminance correction section 31 performs a low-illuminance judgment with respect to RGB data values $C=(C_1, C_2, C_3)$ in the pixel block, and the low-illuminance correction processing section 32 performs correction processing based on a judgment result. A specific judgment and correction processing will now be explained with reference to the flowchart of FIG. 18.

First, a judgment is made upon whether each of the RGB data values $C_m$ (m is 1, 2, or 3) in the pixel block is equal to or smaller than a predetermined lower limit set value $C_n$ (a step S21). When a result of this judgment is negative, it is judged that each value is effective data superior in an SNR, a white color data value W and each RGB data value C are respectively judged as $W^P$ and $C^P$ and stored in the one-block memory 34 (a step S22).

On the other hand, when a result of the judgment at the step S21 is positive, a judgment is made upon whether a single color data value $C_m$ (m is 1, 2, or 3) that is equal to or smaller than the set value $C_n$ is present (a step S23). When a result of this judgment is positive, the single color data value $C_{m1}$ (m1 is 1, 2, or 3) that is not greater than the set value $C_n$ is corrected based on the following Expression (8) (a step S24, a first color correcting section).

$$C_{m1} = W - (S_{m2}'C_{m2} + S_{m3}'C_{m3}) \quad (8)$$

Here, $C_{m2}$ and $C_{m3}$ are color data values that are equal to or above the set value $C_n$.

This Expression (8) multiplies a ratio of W at the time of a high illuminance to $(C_1+C_2+C_3)$, i.e. (200:500 when W=200, $C(C_1+C_2+C_3)=(80, 100, 70))$, by a coefficient judged based on a white balance that is judged in an entire pixel region to obtain $S_{m2}'$ and $S_{m3}'$, multiplies the $S_{m2}'$ and $S_{m3}'$ by the effective color data values $C_{m2}$ and $C_{m3}$ superior in an SNR ratio to obtain $(S_{m2}'C_{m2}+S_{m3}'C_{m3})$, and subtracts $(S_{m2}'C_{m2}+S_{m3}'C_{m3})$ from W obtained in the same block. As a result, information of the color data $C_{m1}$ still included in the white color data W can be extracted and restored.

Here, assuming that a ratio of W and $(C_1+C_2+C_3)$ at the time of a high illuminance is 200:500, the coefficients $S_{m2}'$ and $S_{m3}'$ are, e.g., $S_{m2}'=(200\div250)\times0.82=0.65$, and $S_{m3}'=(200\div250)\times1.16=0.93$. When W=10 and C=(0, 3, 7), $C_{m1}=10-(3\times0.65+7\times0.93)=1.5$ is achieved.

When a result of the judgment at the step S23 is negative, a judgment is made upon whether the two color data values $C_m$ (m is 1, 2, or 3) that are equal to or smaller than the set value $C_n$ are present (a step S25). When a result of this judgment is positive, the two color data $C_{m1}$ and $C_{m2}$ (m1 and m2 are 1, 2, or 3) that are equal to or smaller than the set value $C_n$ are corrected (a step S26). The corrected color data $C_{m1}$ and $C_{m2}$ are stored in the one-block memory 34.

$$C_{m1} = \frac{C_{m1}^p(W - C_{m3})}{C_{m1}^p + C_{m2}^p} \quad (9)$$

$$C_{m2} = \frac{C_{m2}^p(W - C_{m3})}{C_{m1}^p + C_{m2}^p}$$

Expression (9) subtracts the effective color data value $C_{m3}$ (m is 1, 2, or 3) from luminance data W in the target pixel block and prorates a value obtained by this subtraction based on color data values $C_{m1}^P$ and $C_{m2}^P$ of ineffective colors m1 and m2 (having a poor SNR) in color data values $C^P=(C_1^P, C_2^P, C_3^P)$ in a preceding pixel block stored in the one-block memory 34, thereby restoring color data of the colors m1 and m2.

When a result of the judgment at the step S25 is negative, this means that all color data values of R, G, and B are equal to or below the set value $C_n$. In this case, each color data value $C_{ml}$ (l is 1, 2, or 3) is restored based on the following Expression (10) (a step S27).

$$C_{m1} = \frac{C_{m1}^p W}{C_{m1}^p + C_{m2}^p + C_{m3}^p} \quad (10)$$

In Expression (10), the luminance data W in the target pixel block is prorated based on color data values $C_{m1}^P, C_{m2}^P$, and $C_{m3}^P$ of ineffective colors m1, m2, and m3 that are acquired from color data values $C^P=(C_1^P, C_2^P, C_3^P)$ (e.g., $C_1^P=3$, $C_2^P=3$, $C_3^P=2$) in a preceding pixel block stored in the one-block memory 34, thereby restoring the respective color data $C_{m1}, C_{m2}$, and $C_{m3}$.

In Expression (10), values obtained by multiplying the color data values $C_{m1}^P, C_{m2}^P$, and $C_{m3}^P$ by coefficients $S_1, S_2$ and $S_3$ judged based on a color balance may be prorated.

In the above-explained calculation, when an arithmetic operation for multiple rows is required, effecting the arithmetic operation while making reference to signals of preceding several rows stored in the line memory can suffice.

The white color data value W and each color data value $C_{ml}$ restored at the step 527 are stored in the one-block memory (a step S22) and output (a step S28). Then, the processing at the steps S21 to S28 is performed with respect to the next pixel block.

As explained above, in the third embodiment, when whether an illuminance is low is judged based on color data values of R, G, and B and a low illuminance is judged, the pixel W having a high sensitivity is utilized to perform the color data value correction processing. Therefore, color information that is lost due to the low illuminance can be restored in real time, and the solid-state image sensor with a high picture quality can be obtained even if the illuminance is low.

The judgment on a low illuminance and the correction processing for each color data value explained above may be performed on a stage before the color separation processing described in conjunction with the second embodiment, or may be performed simultaneously with the W saturation judgment correction processing explained in the first embodiment.

Fourth Embodiment

A fourth embodiment explained below is obtained by adding a low-illuminance judgment processing in the color separation processing according to the second embodiment.

Figure 19:
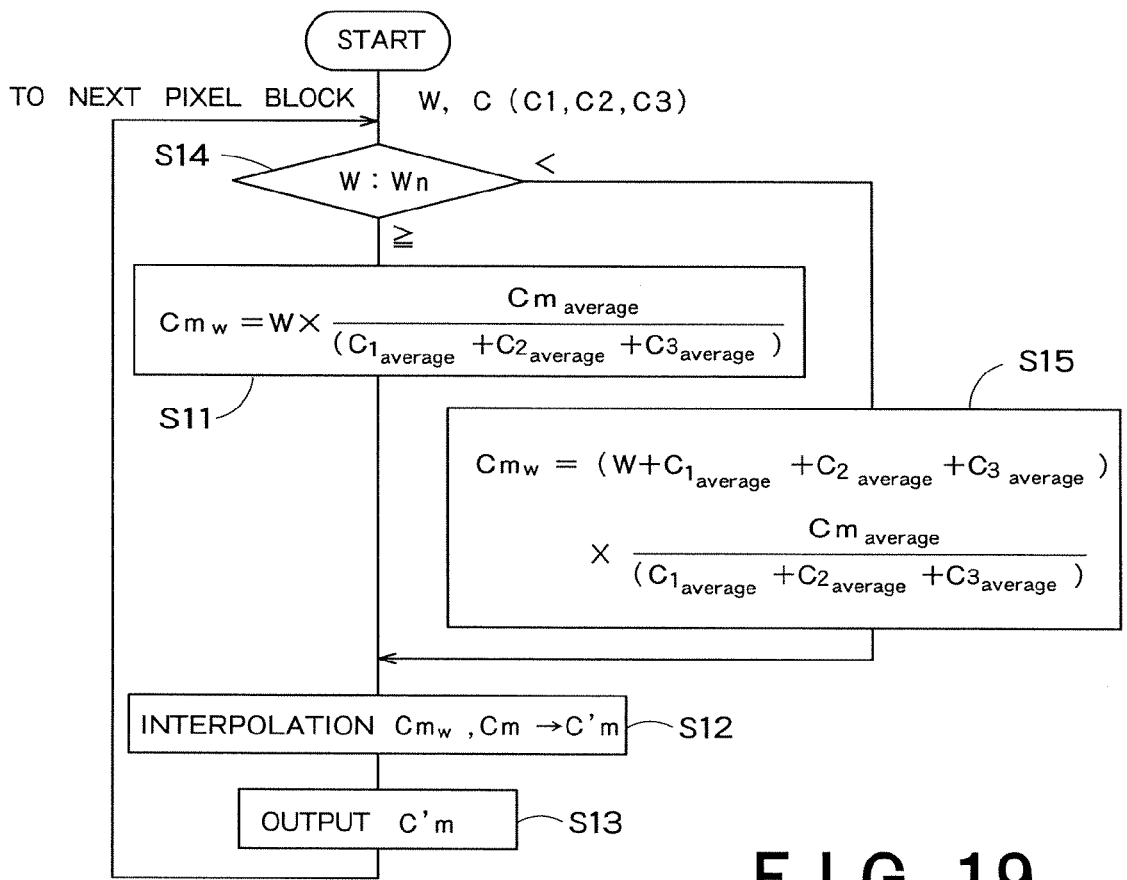
FIG. 19 is a flowchart showing an example of a processing operation performed by a signal processing circuit 6 according to a fourth embodiment.

FIG. 19 is a flowchart showing an example of a processing operation performed by a signal processing circuit 6 according to the fourth embodiment. FIG. 19 shows processing obtained by adding steps S14 and S15 to the processing depicted in FIG. 12.

First, a white color data value W is compared with a predetermined set value $W_n$ (e.g., $W_n$=10 is set in case of 256 tones) (a step S14). When the white color data value W is equal to or larger than $W_n$, color separation processing is performed by using Expressions (2) to (4) (a step S11). On the other hand, when the white color data value W is smaller than $W_n$, the color separation processing is performed based on the following Expression (11).

$$C_{m_W} = (W + C_{1average} + C_{2average} + C_{3average}) \times \frac{C_{m_{average}}}{(C_{1average} + C_{2average} + C_{3average})} \quad (11)$$

In Expression (11), all pieces of surrounding color data R, G, and B are added to the white color data value W as luminance data to generate a color data value $C_{mw}$. Therefore, an SNR ratio of the color data value $C_{mw}$ is improved. In this case, however, since the surrounding pixel data is added as luminance data, a luminance resolution is deteriorated. Therefore, the processing at the step S11 is performed only when light received by the target pixel W has a low illuminance to improve an SNR ratio while sacrificing a luminance resolution.

As explained above, according to the fourth embodiment, when an illuminance of the white color data value W is low, a value obtained by adding the surrounding color data R, G, and B to the white color data value W is multiplied by coefficients $K_1$ to $K_3$ to effect color separation of the white color data value W. Therefore, an illuminance of the white color data value W having a low luminance can be improved, thus avoiding occurrence of black color blurring.

Fifth Embodiment

A fifth embodiment is characterized in color interpolation processing after subjecting a white color data value W to color separation to provide respective pieces of color data R, G, and B and the color interpolation processing is performed in such a manner that output data has the same arrangement as that of data based on a Bayer arrangement.

A signal processing circuit 6 according to the fifth embodiment has the same configuration as that depicted in FIG. 11, and perform a processing operation in accordance with the same flowchart as that in FIG. 12. However, the processing operation at the step S12 depicted in FIG. 12 performed by an interpolation processing section 28 shown in FIG. 11 is different from that in the second embodiment.

The interpolation processing section 28 according to this embodiment uses a red color data value R, a blue color data value B, and $R_W$ and $B_W$ in color-separated color data values $R_W$, $G_W$, and $B_W$ to perform interpolation processing.

Figure 20:
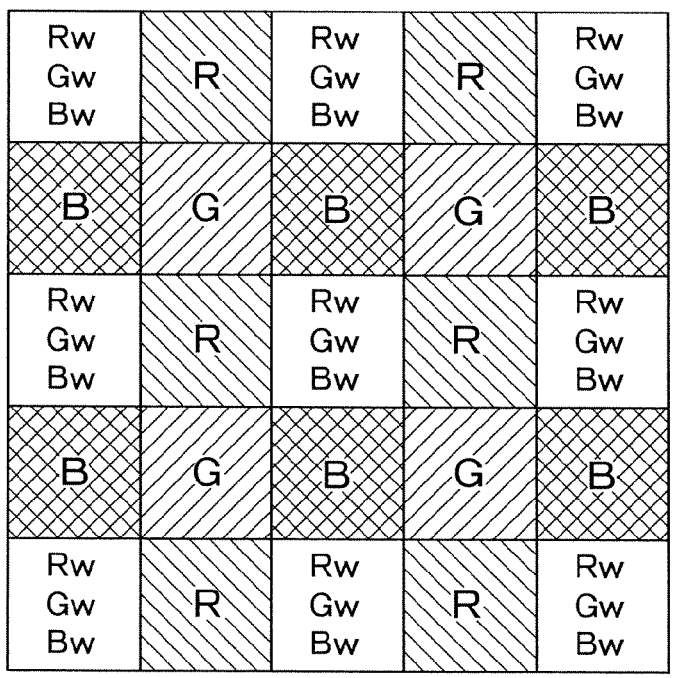
FIG. 20 is a view showing a pixel arrangement immediately after color separation processing is performed.

FIG. 20 shows a pixel arrangement immediately after effecting color separation processing. As shown in the drawing, the color-separated color data values $R_W$, $G_W$, and $B_W$ are allocated to pixel positions of the white color data value W. As shown in FIG. 21A, the interpolation processing section 28 uses the red color data value R and the two color data values $R_W$ that are adjacent to each other in a lateral direction to interpolate a final color data value R'. Therefore, a method of judging an average value of the three values as R' is the simplest method. Likewise, as shown in FIG. 21B, the blue color data value B and the two color values $B_W$ that are adjacent to each other in a vertical direction are used to interpolate a final color data value B'. On the other hand, the green color data value $G_W$ is not subjected to the interpolation processing as shown in FIG. 21C. The interpolation processing is not performed with respect to the green color because imaging data corresponding to the Bayer arrangement is completed based on the color data values G and $G_W$ when the color separation processing is effected.

When such processing is performed, such a data arrangement corresponding to the Bayer arrangement as shown in FIG. 22 can be obtained. Since a general-purpose digital signal processor that processes imaging data output from the solid-state image sensor is often compatible with imaging data having the Bayer arrangement, outputting the imaging data converted into the Bayer arrangement from the solid-state image sensor like this embodiment enables performing various kinds of image processing by using the general-purpose digital signal processor, thereby decreasing a design cost and a component cost in image processing.

As explained above, according to the fifth embodiment, the white color data value W is color-separated into the respective pieces of color data R, G, and B, and then the data arrangement in the pixel block is converted into a data arrangement corresponding to the Bayer arrangement. Therefore, the solid-state image sensor can output imaging data corresponding to the Bayer arrangement, and the general-purpose digital signal processor can be used to perform subsequent image processing.

Sixth Embodiment

The first to the fifth embodiments can be arbitrarily combined to be carried out. For example, a sixth embodiment explained below is characterized in that the processing depicted in FIGS. 10, 18, and 12 is continuously performed.

FIG. 23 is a block diagram showing an example of an internal configuration of a signal processing circuit 6 according to the sixth embodiment. The signal processing circuit 6 depicted in FIG. 23 has a W saturation judgment correction processing section 21 having the same configuration as that depicted in FIG. 8, a low-illuminance judgment correction processing section 30 having the same configuration as that shown in FIG. 17, a color separation interpolation processing section 25 having the same configuration as that shown in FIG. 11, a YUV converting section 35 that converts color data R, G, and B into luminance data Y and color difference data UV, a line memory 36 used by these respective sections for operations, and a one-block memory 37 that stores a processing result.

Each section in the signal processing circuit 6 shown in FIG. 23 may be formed of hardware or software. In any case, basically, processing is sequentially performed in accordance with the respective flowcharts depicted in FIGS. 10, 18, and 12, and then the YUV converting section 35 performs conversion into luminance data and color difference data.

FIG. 24 is a flowchart showing an example of a processing operation performed by the signal processing circuit 6 depicted in FIG. 23. An example where signal processing is performed in units of a pixel block formed of two rows and tow columns depicted in FIG. 2 will be explained hereinafter.

First, in units of the pixel block formed of two rows and two columns, respective RGB color data values C=($C_1$, $C_2$, and $C_3$) and a white color data value W in each pixel block are acquired (a step S31). These pieces of data are obtained from a 1H memory. The acquired one pixel block will be referred to as a target pixel for signal processing hereinafter.

A white color pixel is hard to be saturated on a low-illuminance side but easy to be saturated on a high-illuminance side as compared with pixels R, G, and B. Thus, at a step S32 in FIG. 24 (a second judgment section), a judgment is made upon whether the white color data value W is larger than a lower limit set value $C_n$ (e.g., $C_n$=0). The W saturation judgment correction processing section 21 depicted in FIG. 23 performs this judgment processing. If W≦Cn (in case of a region A in FIG. 9), data C' and W' used for signal processing are changed to data $C^P$ and $W^P$ in a preceding pixel block stored in the one-block memory 22 (a step S33, a preceding block color adjustment section).

When W>$C_n$ is judged at the step S32, the W saturation judgment correction processing section 21 performs W saturation judgment correction processing formed of the same processing procedure as that depicted in FIG. 10 (a step S34). Based on this processing at the step S34, a corrected white color data value W and color data values are output.

Then, the low-illuminance judgment correction processing section 30 performs low-illuminance judgment processing formed of the same processing procedure as that depicted in FIG. 18 (a step S35). Based on this processing at the step S35, a sensitivity of a pixel with a low illuminance in respective pixels R, G, and B is improved.

Subsequently, the color separation interpolation processing section 25 performs color separation processing formed of the same processing procedure as that depicted in FIG. 12 (a step S36). After the pixel W is color-separated into RGB color data values by this processing at the step S36, color data values subjected to interpolation processing are output.

The white color data value W' and the color data values C that are processing results of the steps S36 and S33 are stored in the one-block memory (a step S37).

Then, the YUV converting section 35 converts the three color data values output from the color separation interpolation processing section 25 into luminance data and color difference data (a step S38).

As explained above, according to the sixth embodiment, the W saturation judgment correction processing, the RGB low-illuminance judgment processing, and the color separation processing are continuously performed to generate final color data, thereby obtaining an image superior in color information reproducibility with a high image quality without white color discontinuity or block color blurring.

It is to be noted that each processing does not have to be performed in the order of the W saturation judgment correction processing section 21, the low-illuminance judgment correction processing section 30, and the color separation interpolation processing 25. For example, the processing may be performed in the order of the W saturation judgment correction processing section 21, the color separation interpolation processing 25, and the low-illuminance judgment correction processing section 30. Further, a part of the processing depicted in FIG. 24, e.g., the judgment processing at the step S32 may be omitted.

Seventh Embodiment

Although the color separation processing is performed and then the interpolation processing is performed in FIG. 12, the interpolation processing may be performed and then the color separation processing may be carried out. A seventh embodiment explained below is characterized in that the interpolation processing is performed and then the color separation processing is effected.

Figure 25:
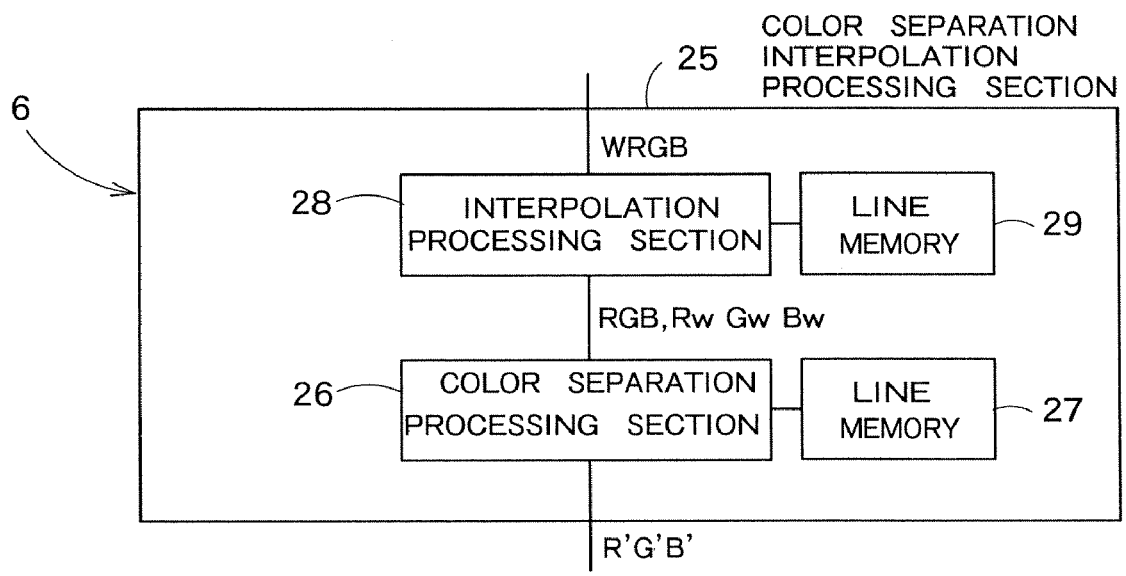
FIG. 25 is a block diagram showing an example of an internal configuration of a signal processing circuit 6 according to a seventh embodiment.
Figure 26:
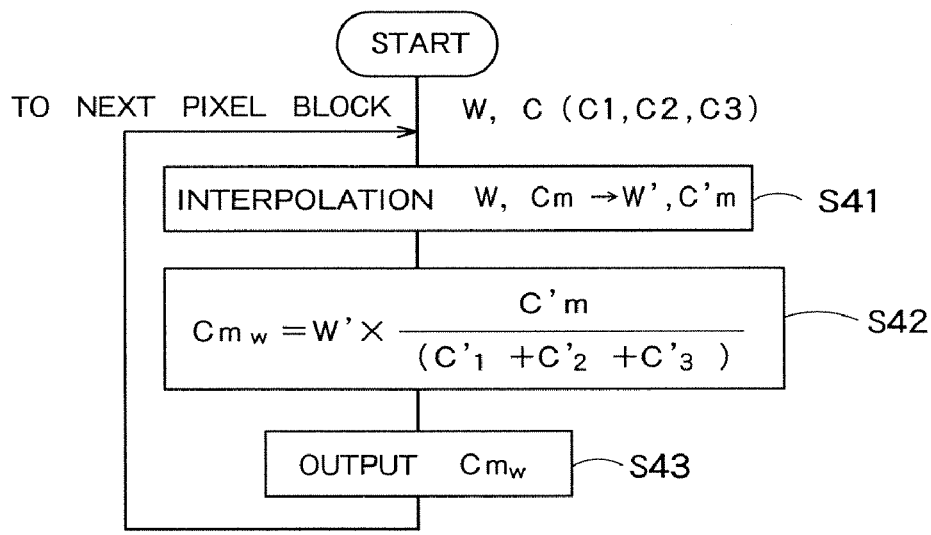
FIG. 26 is a flowchart showing a processing operation of the signal processing circuit 6 depicted in FIG. 25.

FIG. 25 is a block diagram showing an example of an internal configuration of a signal processing circuit 6 according to the seventh embodiment, and FIG. 26 is a flowchart showing a processing operation of the signal processing circuit 6 depicted in FIG. 25.

The signal processing circuit 6 depicted in FIG. 25 uses an interpolation processing section 28 to perform interpolation processing, and then utilizes a color separation interpolation processing section 25 to perform color separation processing. The interpolation processing section 28 acquires color data C ($C_1$, $C_2$, $C_3$) and a white color data value W of a target pixel.

Here, the target pixel is a basic unit of signal processing, and each target pixel has respective pieces of color data R, G, and B and white color W data. As different from in an actual pixel in a pixel array 1, this target pixel is a virtual pixel. In detail, a position of the target pixel is a position of a photoelectric converting element that is present in each pixel in the pixel array 1 or a position of a gravity point of each pixel.

Figure 27A:
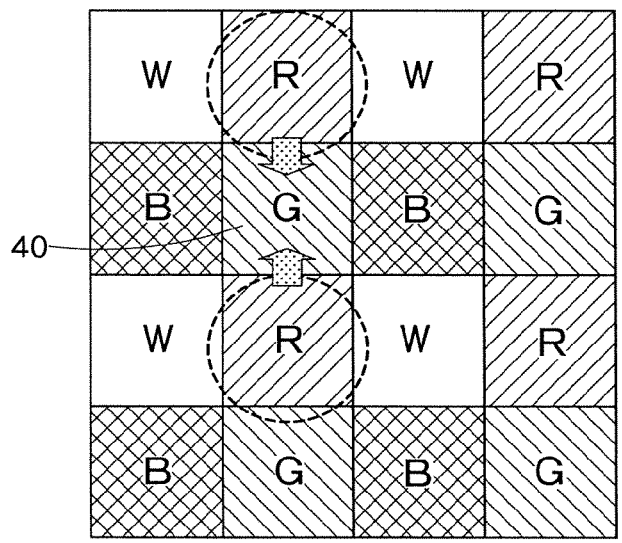
FIG. 27A-C are views for explaining a target pixel 40 in a pixel array 1 with the pixel block formed of two rows and two columns depicted in FIG. 2 being judged as a unit and interpolation processing with respect to the target pixel 40.
Figure 27B:
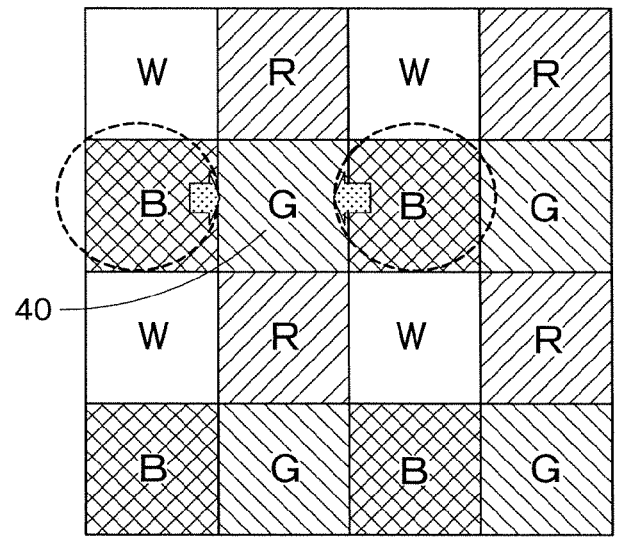
Figure 27C:
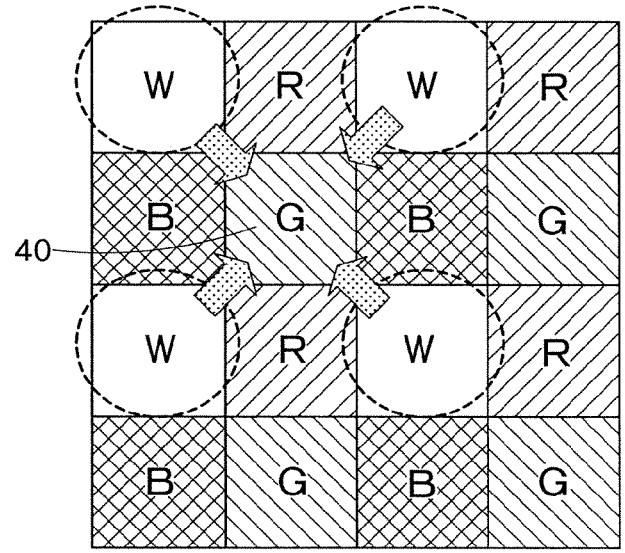

For example, FIG. 27 is a view for explaining a target pixel 40 in the pixel array 1 having the pixel block formed of two rows and two columns depicted in FIG. 2 as a unit. A pixel placed in the second row and the second column from the left-hand side in FIG. 27 is judged as the target pixel 40. An R data value of this target pixel 40 is an average value of data values of upper and lower R pixels as shown in FIG. 27A. Furthermore, a B data value is an average value of data values of right and left B pixels as shown in FIG. 27B, and a G data value is a data value of a pixel G itself placed at the position of the target pixel 40. A W data value is an average value of data values of pixels W placed at four corners of the target pixel 40.

When such interpolation processing is performed, RGB data values and a W data value of the target pixel 40 are judged. It is to be noted that, when the signal processing circuit 6 performs the interpolation processing, the line memory depicted in FIG. 25 is utilized. Therefore, color data values surrounding the target pixel 40 are previously stored in this line memory.

The signal processing circuit 6 according to this embodiment first utilizes the interpolation processing section 28 to perform the interpolation processing based on the above-explained processing order as shown in FIG. 26 (a step S41). As a result, each of RGB data values $C'_m$ and a W data value W' are judged in accordance with each target pixel 40.

Then, the color separation interpolation processing section 25 calculates and outputs three color data values of the target pixel 40 based on the following Expression (12) (steps S42 and S43).

$$C_{mw} = W' \times \frac{C'_m}{(C'_1 + C'_2 + C'_3)} \tag{12}$$

The three color data values of the target pixel 40 calculated at the step S42 are subjected to YUV conversion in accordance with each target pixel 40.

As explained above, according to the seventh embodiment, the interpolation processing is carried out in accordance with each target pixel 40 to acquire each RGB data C and the white color data value W, and then the signal processing is performed in accordance with the flowchart of FIG. 26. Therefore, the signal processing can be carried out while considering luminance information in a finer unit than the pixel block, thereby acquiring an image that is superior in color reproducibility and has a high spatial resolution.

Eighth Embodiment

An eighth embodiment is characterized in that a processing operation when RGB data C=(C1, C2, C3) has a low illuminance is different from that in the third embodiment.

Although a signal processing section according to the eighth embodiment performs a processing operation in accordance with a flowchart of FIG. 18, A processing at a step S27, or B processing at steps S26 and S27, or (C) processing operations at steps S24, S26, and S27 are different from those in the first and the second embodiments.

Specifically, when performing the processing of A, B, or (C), each of RGB data values C is restored based on the following Expression (13)

$$Cm_1 = W/S_1, \; Cm_2 = W/S_2, \; Cm_3 = W/S_3 \tag{13}$$

Here, $S_1$, $S_2$, and $S_3$ are coefficients judged based on a white balance, and they are judged in accordance with an entire pixel region. That is, in case of imaging an object having a low illuminance, the arithmetic operation represented by Expression (13) is performed when (D) all three color data values in RGB data values have a low SNR and ineffective, (E) when two color data values alone in the same are ineffective, or (F) when one color data value alone in the same is ineffective. As a result, black and white color information that is in proportion to luminance data W can be generated.

As explained above, according to the eighth embodiment, when each of the RGB data values has a low illuminance, black and white color information can be detected as the RGB data values by a simple technique without making reference to a preceding block. That is, according to this embodiment, when a color signal can be judged as a gray scale on a low-illuminance side, the color signal on the low-illuminance side can be reproduced as black and white information by a simple signal processing.

Ninth Embodiment

Although the example where the processing operations are performed in units of the pixel block formed of two rows and two columns has been explained in conjunction with the first embodiment, the pixel block having a pixel W, a pixel R, a pixel G, and a pixel B may have other configurations than that formed of two rows and two columns.

For example, FIG. 28 is a view showing an example of a pixel array 1 in which each row including pixels W alone is provided every other line. In case of FIG. 28, pixels R, G, and B are sequentially repeatedly arranged between the rows including the pixels W. Therefore, a unit of a pixel block 50a is two rows and three columns. It is to be noted that the alignment order of the pixels RGB is not restricted to a specific order.

In case of the pixel array 1 depicted in FIG. 28, when the vertical scanner 2 depicted in FIG. 1 sweeps the rows of the pixels W alone at a high speed before the pixels R, G, and B, luminance information alone can be obtained before acquiring color information.

When reading the rows of the pixels W at a frame rate that is double a counterpart of other rows, luminance data alone can be read out at a double speed by alternately and repeatedly reading out a frame formed of data including pixels W alone (WWW) and a frame formed of (WWRGB) in the pixel block made of two rows and three columns.

FIG. 29 is a view showing an example of a pixel block 50b in which an alignment of the pixels in FIG. 28 is partially changed. In case of FIG. 29, four rows and four columns constitute a pixel block, each row including pixels W alone is arranged every other line, and a row formed of pixels B, G, R, and G is arranged between the rows including the pixels W alone. In the row formed of pixels B, G, R, and G, the number of pixels G is double the number of pixels of other colors. As a result, a luminance resolution can be improved as compared with an example where pixels R, G, and B are evenly provided.

In FIG. 29, an alignment of pixels in the row formed of pixels B, G, R, and G can be arbitrarily changed. However, when pixels G are not adjacent to each other, a luminance can be evenly detected, and hence this alignment is desirable.

FIG. 30 is a view showing an example of a pixel block 50c in which an alignment of the pixels in FIG. 29 is partially changed. In FIG. 30, in order to improve color reproducibility and a green color resolution of a G signal, pixels W and pixels G in FIG. 29 are counterchanged, and each row formed of the pixels G alone is provided every other line. In this example, when the row formed of the pixels G alone that can be used to acquire luminance information is read out like the pixels W, a luminance resolution can be improved like the example depicted in FIG. 29.

As explained above, according to the ninth embodiment, since the pixel block in which the row formed of the pixels W or the pixels G alone is arranged every other line is provided, luminance information alone can be acquired at a high speed prior to color information.

10th Embodiment

A 10th embodiment provides a structure where pixels W are arranged in a zigzag pattern in a pixel array 1. The 10th embodiment is also applied to a solid-state image sensor having the same configuration as that depicted in FIG. 1, and an internal configuration of a signal processing section in the solid-state image sensor is the same as that of the second embodiment, thereby omitting a detailed explanation of the signal processing section.

FIG. 31 is a view showing a pixel array 1 according to the 10th embodiment. The pixel array 1 in FIG. 31 has a pixel block 50d formed of two rows and six columns. Each pixel block 50d has six pixels W arranged in the zigzag pattern and a total of six pixels R, G, and B that are alternately arranged between the pixels W.

Since one half of the pixels in the pixel block 50d is the pixels W, a luminance resolution can be improved. In particular, when the pixels R, G, and B have a low illuminance and an SNR of the pixels W is higher than a minimum reference value, the high luminance resolution can be maintained in both a horizontal direction and a vertical direction.

FIG. 32 is a view showing a pixel array 1 in which an alignment of the pixels in FIG. 31 is partially changed. In a pixel block 50e in the pixel array 1 depicted in FIG. 32, the number of pixels G is double the number of pixels R and the number of pixels B. As a result, reproducibility of the green color can be improved, and a luminance resolution can be further enhanced as compared with the example shown in FIG. 31.

FIG. 33 is a view showing a pixel array 1 in which the pixels W and the pixels G in FIG. 32 are counterchanged. Since the number of pixels W in a pixel block 50f in the pixel array 1 shown in FIG. 33 is smaller than that depicted in FIG. 32, a luminance resolution is reduced, but green color resolution and color reproducibility can be improved.

As explained above, according to the 10th embodiment, since the pixels W or the pixels G are arranged in the zigzag pattern, the luminance information can be uniformly grasped in detail, thereby improving a luminance resolution.

11th Embodiment

Although the example where the respective pixels are arranged in parallel with vertical and horizontal axes on an imaging plane of the pixel array 1 has been explained in the first to the 10th embodiments, each pixel may be obliquely arranged at an angle within the range of 0 to 90° with respect to the vertical and horizontal axes of the imaging plane. An example where each pixel is obliquely arranged at an angle of 45° with respect to the vertical and horizontal axes will now be explained. It is to be noted that the 11th embodiment is applied to a solid-state image sensor having the same structure as that shown in FIG. 1. An internal configuration of a signal processing section in the solid-state image sensor is the same as that of the first or the second embodiment, thereby omitting a detailed explanation of a signal processing section.

FIG. 34 is a view showing a pixel array 1 according to an 11th embodiment. In a pixel array 1 depicted in FIG. 34, respective pixels are closely arranged in a direction inclined at 45° with respect to vertical and horizontal axes (up, down, right, and left directions in a page space) of an imaging plane.

Each pixel has a square shape, and it has a rhombic shape since it is inclined at 45°. In this case, a so-called honey-comb structure where respective pixels are arranged in a checkered pattern is provided. Therefore, when interpolation processing is performed in a lateral direction (the horizontal direction), the apparent number of pixels per pixel area is double the number of pixels that are not inclined, thereby improving an apparent resolution.

The pixel array 1 in FIG. 34 has each row formed of pixels G alone that is provided every other line in the horizontal direction, and also has each row in which a pixel W and a pixel R are repeated between the rows of the pixels G. In FIG. 34, four rows and four columns inclined at 45° are judged as a pixel block 50g. A pixel number ratio W:R:G:B in FIG. 34 is 2:1:4:1, and the number of the pixels W and the number of the pixels G are relatively large, thereby acquiring more luminance information.

FIG. 35 is a view showing a pixel array 1 according to a modification of FIG. 34. The pixel array 1 in FIG. 35 has each row formed of pixels W alone that is provided every other line in a horizontal direction, and also has each row in which pixels R, G, and B are repeated between the rows of the pixels W. A pixel number ratio W:R:G:B in a pixel block 50h in FIG. 35 is 4:1:2:1. A ratio of the pixels W is higher than that in FIG. 34, and hence a luminance sensitivity is high. However, a ratio of the pixels G is smaller than that in FIG. 34. Therefore, a color resolution is deteriorated.

Moreover, in case of FIG. 35, when a vertical scanner 2 is used to select and read each row formed of the pixels W alone at a high speed, high-speed imaging of a gray scale image is enabled. Alternatively, the rows formed of the pixels W alone are thinned out, selected, and read, imaging can be performed at a high speed in the same pixel arrangement as the regular Bayer arrangement.

As explained above, according to the 11th embodiment, since each pixel is obliquely arranged at an angle of 45° with respect to vertical and horizontal axes of an imaging plane, the apparent number of pixels per unit area can be doubled, thus increasing a resolution. Additionally, since the rows formed of the pixels G or the pixels W alone can be selected and read at a high speed, imaging can be performed at a high speed in the same pixel arrangement as the regular Bayer arrangement.

Figure 36:
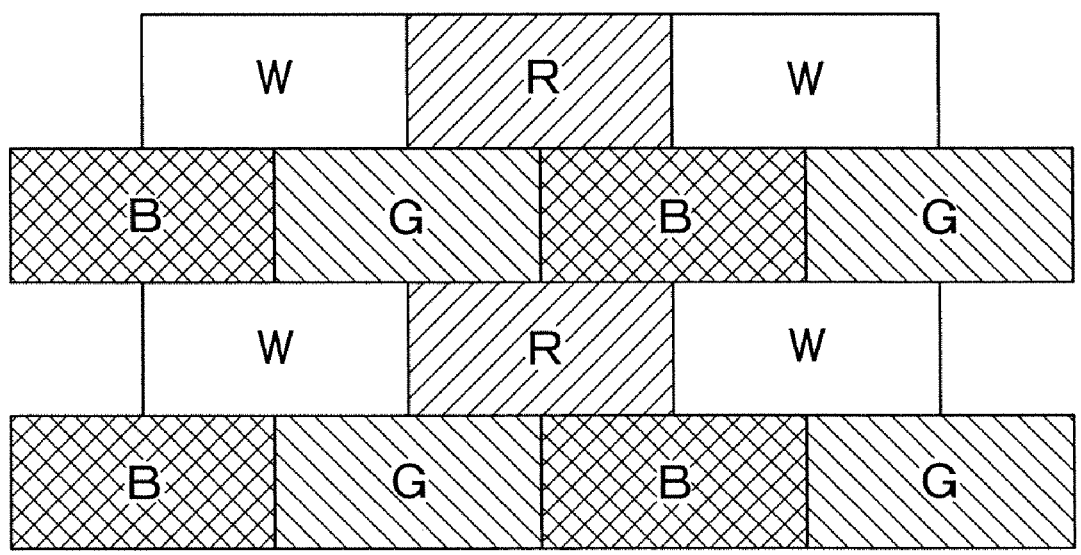
FIG. 36 is a view showing a pixel array in which pixels in two rows adjacent to each other are shifted by an amount corresponding to a half pixel in a lateral direction.

FIGS. 34 and 35 show the example where each pixel is obliquely arranged at an angle of 45° with respect to the vertical and horizontal axes of the imaging plane. However, the pixels in two rows adjacent to each other may be shifted in a lateral direction by an amount corresponding to a half pixel and arranged as shown in FIG. 36. In this case, a density of the pixels in the vertical direction is doubled as compared with an example where the pixels are not shifted by an amount corresponding to a half pixel, thereby obtaining a double resolution.

Additionally, in place of the example shown in FIG. 36, the pixels in two columns adjacent to each other may be shifted by an amount corresponding to a half pixel and arranged. In this case, a density of the pixels in the lateral direction is doubled as compared with an example where the pixels are not shifted by an amount corresponding to a half pixel, thus acquiring a double resolution.

As explained above, when the respective pixels in two rows adjacent to each other are shifted by an amount corresponding to a half pixel in the vertical or horizontal direction and arranged, the same effect as that in the example where each pixel is inclined at 45° as shown in FIG. 34 or 35 can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A solid-state image sensor, comprising:
a plurality of pixels which are formed in matrix form on a semiconductor substrate, each pixel having a photoelectric converting element which outputs an electric signal obtained by photoelectric conversion;
a read-out circuit configured to read out the electric signals outputted from the plurality of pixels; and
a signal processing section configured to perform signal processing with respect to the electric signals read out from the read-out circuit,
wherein the plurality of pixels includes:
a plurality of first pixels which leads incident light of a visible light wavelength band to a corresponding photoelectric conversion element via a transparent layer;
a plurality of second pixels, each having a first color filter having a higher transmissivity in a first visible light wavelength band within the visible light wavelength band, as compared to a transmissivity in a first remaining portion of the visible light wavelength band outside the first visible wavelength band;
a plurality of third pixels, each having a second color filter having a higher transmissivity in a second visible light wavelength band, different from the first visible light wavelength band, within the visible light wavelength band, as compared to a transmissivity in a second remaining portion of the visible light wavelength band outside the second visible wavelength band; and
a plurality of fourth pixels, each having a third color filter having a higher transmissivity in a third visible light wavelength band, different from the first and second visible light wavelength bands, within the visible light wavelength band, as compared to a third remaining portion of the visible light wavelength band outside the third visible wavelength band,
wherein the signal processing section includes:
a color acquisition section configured to acquire a first color data value $C_1$, a second color data value $C_2$, a third color data value $C_3$ and a white color data value W in a target pixel block including a plurality of pixels to perform signal process;
a color separation processing section configured to separate the white data value into a plurality of colors based on the following Expressions (2) to (4) to generate the first color data value $C1_w$ of a first color, the second color data value $C2_w$ of a second color and the third color data value $C3_w$ of a third color;

$$C1_w \leftarrow W \cdot K_1 \quad (2)$$

$$C2_w \leftarrow W \cdot K_2 \quad (3)$$

$$C3_w \leftarrow W \cdot K_3 \quad (4)$$

where $K_1$, $K_2$, and $K_3$ indicate color ratios, and are determined by the color data values $C_1$, $C_2$ and $C_3$.

2. The sensor according to claim 1,
wherein the signal processing section has a white color judgment section configured to judge whether the white color data value W is a predetermined set value or more; and the color separation processing section separates the white color data value into a plurality of colors based on the Expressions (2) to (4) when the judgment result of the white color judgment section is YES, and separates the white color data value into a plurality of colors based on the following Expression (6) when the judgment result of the white color judgment section is NO, to generate the color data values C1w, C2w and C3w:

$$C_{m_W} = (W + C_{1average} + C_{2average} + C_{3average}) \times \frac{C_{m_{average}}}{(C_{1average} + C_{2average} + C_{3average})}. \qquad (6)$$

3. The sensor according to claim 1, further comprising:
an interpolation processing section configured to correct the color data value of the target pixel by using the color data values C1w, C2w and C3w generated by the color separation processing section and the color data value of the target pixel around the white color pixel.

4. The sensor according to claim 3,
wherein the interpolation processing section corrects the color data value of the target pixel by using the color data values C1w, C2w, C3w generated by the color separation processing section and the color data value of the target pixel around the white color pixel, in order to set pixel arrangement in the pixel block to a Bayer array.

5. The sensor according to claim 1,
wherein the signal processing section has an interpolation processing section configured to perform interpolation process based on the color data values C1, C2 and C3 acquired by the color acquisition section and the white color data value W to calculate the interpolated color data value and the white color data value for each pixel; and
the color separation processing section performs color separation process by the Expressions (2) to (4) by using the color data value interpolated by the interpolation processing section and the white color data value.

6. The sensor according to claim 1, wherein
the first visible light wavelength band corresponds to red light;
the second visible light wavelength band corresponds to green light; and
the third visible light wavelength band corresponds to blue light.

7. The sensor according to claim 1,
wherein the color ratios Km (m=1, 2 and 3) are expressed by the following expressions, where $R_{average}$, $G_{average}$, and $B_{average}$ are averages of color data values R, G, and B, respectively, of a plurality of pixels around the target pixel W:

$$K_1 = \frac{R_{average}}{(G_{average} + R_{average} + B_{average})} \qquad (5)$$

$$K_2 = \frac{G_{average}}{(G_{average} + R_{average} + B_{average})} \qquad (6)$$

$$K_3 = \frac{B_{average}}{(G_{average} + R_{average} + B_{average})}. \qquad (7)$$

* * * * *